United States Patent [19]
Yoneda

[11] Patent Number: 5,648,282
[45] Date of Patent: Jul. 15, 1997

[54] AUTODOPING PREVENTION AND OXIDE LAYER FORMATION APPARATUS

[75] Inventor: Kenji Yoneda, Kyoto, Japan

[73] Assignee: Matsushita Electronics Corporation, Osaka, Japan

[21] Appl. No.: 66,758

[22] Filed: May 24, 1993

[30] Foreign Application Priority Data

Jun. 26, 1992 [JP] Japan ................... 4-168774
Jul. 6, 1992 [JP] Japan ................... 4-178060

[51] Int. Cl.$^6$ ................... H01L 21/316
[52] U.S. Cl. ................... 437/40; 437/41; 437/95; 437/239; 437/913; 437/919
[58] Field of Search ................... 437/95, 913, 239, 437/919, 40 GS, 41 GS

[56] References Cited

U.S. PATENT DOCUMENTS

| | | | |
|---|---|---|---|
| 3,696,276 | 10/1972 | Boland | 317/235 R |
| 3,886,005 | 5/1975 | Cota et al. | 148/188 |
| 4,386,968 | 6/1983 | Hinkel et al. | 148/1.5 |
| 4,430,492 | 2/1984 | Temple | 29/571 |
| 4,610,730 | 9/1986 | Harrington et al. | 148/1.5 |
| 4,837,173 | 6/1989 | Alvis et al. | 437/24 |
| 4,994,887 | 2/1991 | Hutter et al. | 357/43 |
| 5,045,492 | 9/1991 | Huie et al. | 437/47 |
| 5,066,607 | 11/1991 | Banerjee | 437/52 |
| 5,106,768 | 4/1992 | Kuo | 437/34 |
| 5,141,891 | 8/1992 | Arima et al. | 437/44 |
| 5,173,440 | 12/1992 | Tsunashima et al. | 437/164 |
| 5,244,843 | 9/1993 | Chau et al. | 437/239 |
| 5,278,441 | 1/1994 | Kang et al. | 257/371 |

Primary Examiner—Charles L. Bowers, Jr.
Attorney, Agent, or Firm—Rogers & Wells

[57] ABSTRACT

To form a MOS transistor with a LDD structure, the transistor is formed in a well region. There is formed a gate oxide layer on a silicon substrate and an N$^+$ type poly-silicon layer serving as a gate electrode is formed on the gate oxide layer. The poly-silicon layer is doped with phosphorus atoms. Then, a surface of the silicon substrate is exposed in a LDD region serving as a source/drain region as formed with phosphorus implantation. The LDD region of the transistor is implanted with phosphorus ions. Subsequently, a side wall is formed on the gate electrode. To enhance the adherence of the side wall material and activate the phosphorus ions implanted in the previous step, annealing and formation of an oxide film are effected. This thermal treatment prevents the phosphorus atoms from deporting the gate electrode of the poly-silicon layer and self diffusing into the LDD region. This thermal treatment is performed with nitrogen gas containing 1 to 5 volume % at the initial stage thereof.

8 Claims, 21 Drawing Sheets

| | SUBSTRATE THROW | TEMP STABILIZE | ANNEAL | OXIDATION | TEMP INCREASING | ANNEAL | TEMP DECREASING | SUBSTRATE REMOVAL |
|---|---|---|---|---|---|---|---|---|
| TIME PERIOD | 30 MIN | 20 MIN | 30 MIN | 9 MIN | 25 MIN | 20 MIN | 25 MIN | 30 MIN |
| $N_2$ 14.55 ℓ/min | | | | | | | | |
| $O_2$ 0.45 ℓ/min (3%) | | | | | | | | |
| $O_2$ 15 ℓ/min | | | | | | | | |
| $H_2$ 7.5 ℓ/min | | | | | | | | |

900°C substrate throw; ramp to 1000°C at 4°C/min; ramp down at 4°C/min.

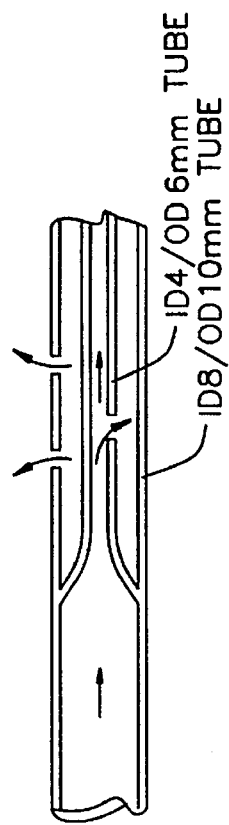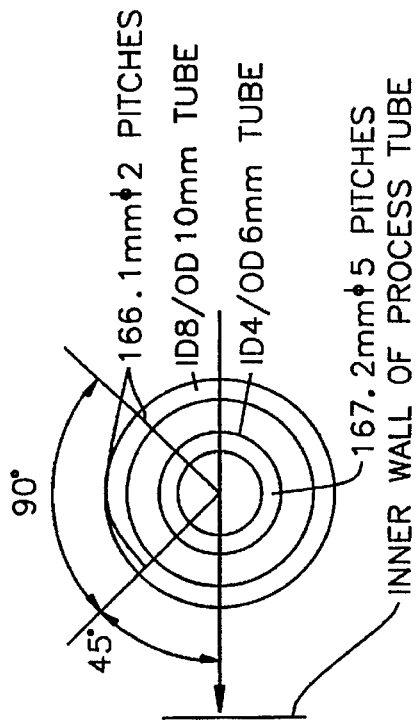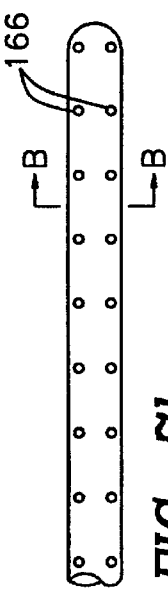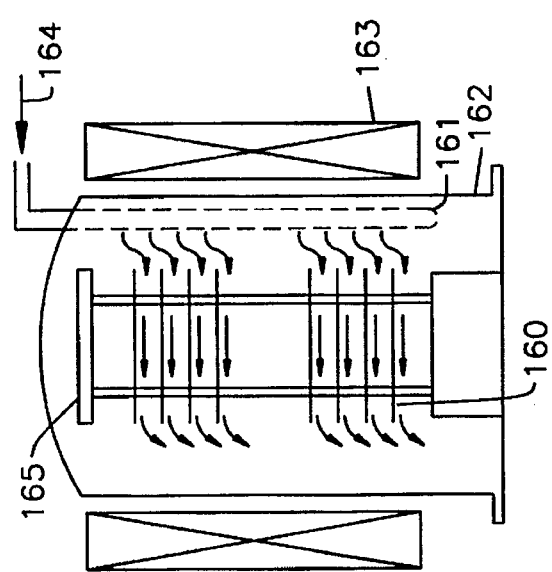

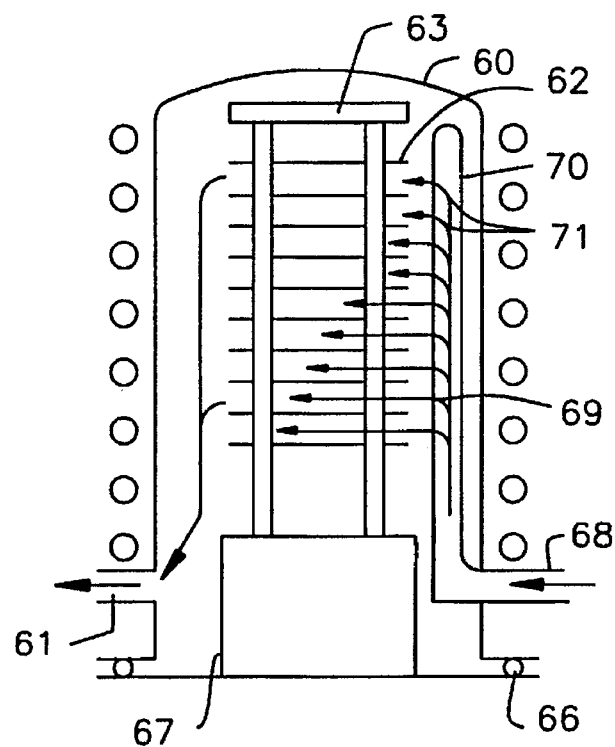
(PRIOR ART)
FIG. 20
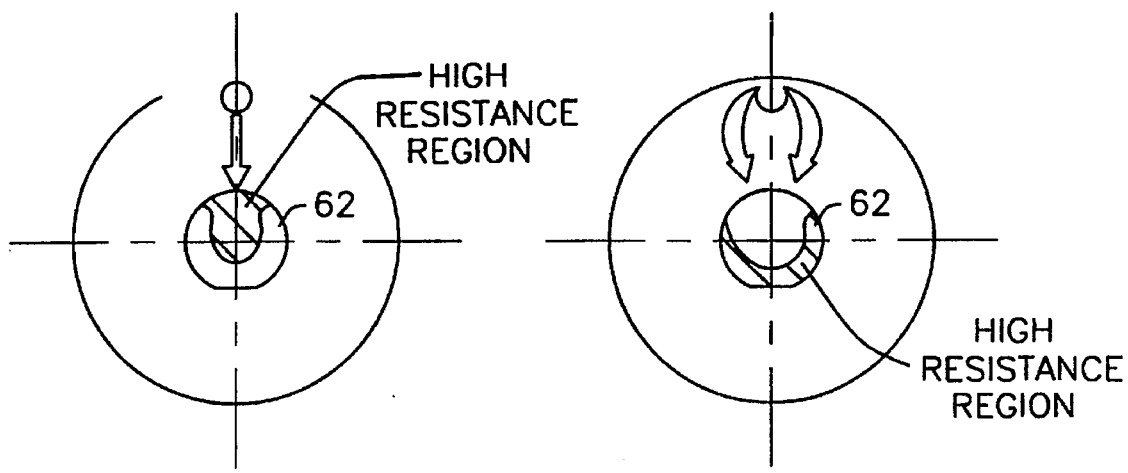
(PRIOR ART)
FIG. 21a
(PRIOR ART)
FIG. 21b

| NUMBER OF SUBSTRATES TREATED (NUMBER/BATCH) | 25 | 50 | 75 | 100 |
|---|---|---|---|---|
| SHEET RESISTANCE (Ω/□) | UNIFORMITY (%) | | | |
| 27.0 | ±7.4 | ±7.6 | ±7.8 | ±7.9 |
| 18.0 | ±3.6 | ±4.0 | ±4.3 | ±4.0 |
| 700.0 | ±11.4 | ±11.7 | ±10.0 | ±10.5 |

FIG. 24

AUTODOPING PREVENTION AND OXIDE LAYER FORMATION APPARATUS

BACKGROUND OF THE INVENTION

1. Field of the Invention

The present invention relates to a method for manufacturing semiconductor devices and manufacturing apparatus therefor, and more particularly to a method for forming a gate oxide layer in MOS devices and other oxide layers and manufacturing apparatus therefor.

2. Description of the Related Prior Art

Manufacture of semiconductor devices and particularly MOS devices includes a number of steps of forming gate oxide layers and other oxide layers. With the recent trend toward miniaturization and very large scale integration, multi-layer poly-silicon layers have been in wide use. For instance, in 1 M-bit dynamic RAMs, a cell plate forming a part of a cell capacitor is made of a poly-silicon layer containing a high concentration of a conductive dopant. Moreover, gate electrodes of selector transistors and peripheral transistors are also made of poly-silicon layers having a high concentration of a conductive dopant.

Such poly-silicon layers having a high concentration of a conductive dopant are indispensable to today's LSI devices as wiring material and electrode material of MOS transistors. Those poly-silicon layers are grown by the CVD technique. Therefore, the poly-silicon layers are grown not only on a top surface of a semiconductor substrate but also on a back surface thereof. Because those poly-silicon layers contain a very high concentration of the conductive impurity, the poly-silicon layers may be considered as a diffusion source of the impurity on the semiconductor substrate carrying the poly-silicon layers thereon. Especially, when a surface of the semiconductor substrate is exposed in the vicinity of the poly-silicon layers containing the conductive impurity, the impurity in the poly-silicon layers may travel and move into the substrate by way of the exposed surface of the semiconductor substrate after an oxide layer is disposed on the surface of the semiconductor substrate or thermal treatment including annealing is carried out subsequent to the formation of the poly-silicon layers.

FIGS. 15(a) to 15(d) are device profiles showing the sequence of formation of a gate oxide layer of transistors in DRAMs. The device illustrated includes a P type silicon substrate 1, an isolation region 2, a cell plate 3 of N⁺ type poly-silicon, a capacitor insulator layer 4, a N⁺ type diffusion layer 5, a P type diffusion layer 6, unintentional diffusion 7 of phosphorus from the N⁺ poly-silicon layer, a gate oxide layer 8, an N type diffusion region 9 and an N⁺ type poly-silicon layer 10.

As is seen from FIGS. 15(b) and 15(c) showing the sequence of the formation of the gate oxide layer, the cell plate 3 is made of a poly-silicon layer containing a high concentration of the conductive impurity. Subsequent to the formation of the poly-silicon layer, phosphorus would externally or unintentionally enter and thermally diffuse into an adjoining transistor region exposed via a surface of the substrate during the initial stage of the formation of the gate oxide layer 8, including insertion of silicon substrates, temperature ramping and annealing. In general, the threshold voltage of MOS transistors is sensitive to and varies with chance in the impurity concentration at the surface of the substrate beneath the gate electrode. To this end, substantial variation in the threshold voltage is observed. In the case of an N channel transistor as shown in FIGS. 15(a) to 15(c), phosphorus or N type dopant diffuses itself from the cell plate 3, turning the conductivity type of the channel region of an adjoining MOS transistor into N type. The threshold voltage of that MOS transistor shifts substantially to the negative direction to render the transistor conductive at all times.

FIGS. 16(a) to 16(c) are device profiles of a LDD structure MOS transistor. The MOS transistor illustrated includes a P type silicon substrate 21, a P type well region 22, an N type well region 23, an isolation region 24, gate oxide layers 25, a P channel gate 26 of N⁺ type poly-silicon, an N channel gate 27 of N⁺ type poly-silicon, a photoresist 28, LDD phosphorus implantation 29, phosphorus-implanted LDD regions 30, N type diffusion regions 31 by self-diffusion, external diffusion of phosphorus 32 from the gate electrodes, channel regions 33, N⁺ type source/drain regions 34 and P type source/drain regions 35.

The transistor gates are usually formed of the poly-silicon layer 27 containing a conductive impurity. After the gate electrodes are formed, low density impurity implantation is effected on the source/drain regions by the ion implantation method to build a LDD structure therein (FIG. 16(a)). Thermal treatment is thereafter usually carried out to activate the ion implanted impurity. Under the circumstance, the impurity in the poly-silicon gate layer 27 may diffuse into the source/drain LDD region (FIG. 16(b)). Where the conductivity of the LDD region is the same as that of the impurity in the poly-silicon layer 27, the impurity concentration of the LDD region of the transistor becomes higher and eventually the transistor exhibits a short channel. In other words, in the N channel transistor of FIG. 16(c), the N type impurity concentration of the LDD region becomes higher and the diffusion length in a lateral direction becomes longer due to phosphorus atoms self-diffused from the N type poly-silicon layer 27. For this reason, the channel region 33 becomes shorter, resulting in the short channel. On the other hand, where the conductivity of the LDD region is opposite that of the impurity of the poly-silicon gate layer, the impurity in the LDD region is compensated and lowered by the impurity emerged from the poly-silicon layer. The LDD region exhibits increase in resistance and, in the worst case, renders the transistor an offset channel type transistor and eventually deteriorates drive performance.

In FIG. 16(b), phosphorus of the opposite conductivity type to the P type source/drain region of the P channel transistor diffuses itself into the source/drain region, causing compensation between the P type and N type impurities. In FIG. 16(c), a high resistance N type diffusion layer 31 is developed in the source/drain region of the P channel transistor. At this moment the P channel transistor turns to the offset channel transistor so that the threshold voltage substantially shifts to the positive direction and the drive performance of the P channel transistor remarkably drops.

FIGS. 17(a) to 17(c) are device profiles of a MOS transistor with a DDD (Double-Diffused Drain) structure. The MOS transistor illustrated includes a P type silicon substrate 41, a P type well region 42, an N type well region 43, an isolation region 44, gate oxide layers 45, a P channel gate 46 of N⁺ type poly-silicon, an N channel gate 47 of N⁺ type poly-silicon, a photoresist 48, DDD phosphorus implantation 49, phosphorus-implanted DDD regions 50, N type diffusion regions 51 by self-diffusion, external diffusion of phosphorus 52 from the gate electrodes, channel regions 53, N⁺ type source/drain regions 54 and P type source/drain regions 55.

Like the LDD structure device, a low concentration of an impurity is ion implanted in the DDD region (FIG. 17(a)).

Thereafter, the impurity diffuse into the DDD region due to self diffusion of the poly-silicon layer or gate electrode 47 having a high concentration of an impurity during the initial stage of thermal treatment for buildup of the DDD region. When the impurity in the DDD region is of the same conductivity type as that in the poly-silicon layer gate, the short channel state is observed. If the case is reverse, the offset channel state is seen. Otherwise, if a poly-silicon layer having a high concentration of impurity is disposed on the back of the silicon substrate, the impurity may diffuse into the top surface of another silicon substrate facing against the back of the first silicon substrate in an oxidation furnace, causing the above discussed problems. The phenomenon is merely that where the poly-silicon layer containing a high concentration of a conductive impurity serves as a diffusion source to allow the impurity to diffuse into an exposed portion of a surface of the semiconductor substrate adjacent to the diffusion source. This phenomenon is called "autodoping." The extent of the autodoping greatly depends upon the temperature, time and atmosphere of thermal treatment in a thermal treatment furnace, the pitch of silicon substrate placement, the structure of a silicon substrate boat, gas flows in the furnace and the structure of an electric furnace. With a smaller pitch of silicon substrate placement, and with a closed structure of the boat, the autodoping becomes significant. Recently, vertical type electric furnaces have attracted more attention and been replacing gradually the conventional horizontal furnace. However, where the vertical type furnace is used, the autodoping is more often significantly observed.

The conventional thermal treatment furnace for carrying out annealing and oxidation is depicted in FIG. 18. The vertical type furnace is illustrated, which comprises a process tube 60, an exhaust air outlet 61, a silicon substrate 62, a boat 63, a heater 64, a cap 65, a seal 66, a pedestal 67, a gas inlet 68, and a process gas flow 69. In the conventional furnace structure, a process gas is introduced from the top of the process tube 60 and discharged from the exhaust air outlet 61 at a bottom portion of the tube after flowing inside the process tube 60. At this time the process gas flows from the top to bottom of the process tube 60. As a consequence, a layer flow is seen around the silicon substrate 62, which makes the process gas difficult to flow toward the center portion of the furnace. A gas of the conductive impurity emerging from the poly-silicon layer containing a high concentration of the impurity formed on a top surface or a back surface of silicon substrate stays between the silicon substrates around the center of the silicon substrates, because of no gas flow between the silicon substrates. As a result, the autodoping takes place at the exposed silicon surfaces of the silicon substrates. Moreover, in the impurity diffusion furnace designed to form uniformly impurity regions with the process gas, the process gas faces difficulty in flowing between the silicon substrates and among other things flowing toward the center portions of the silicon substrates. In this case, supply of the process gas toward the center portion of the silicon substrates 62 is controlled and dominated by diffusion. Where the impurity diffusion device of the above mentioned configuration is used, the impurity concentration is different from place to place within the silicon substrates 62 and lower at the center portion of the silicon substrates than at the peripheral portion thereof. In addition, a remarkable difference is observed in impurity concentration between an upper one of the silicon substrate 62 and a lower one in the process tube 60, because the density of the process gas decreases toward the bottom of the process tube 60. Where diffusion is effected with the conventional impurity diffusion furnace, the impurity concentration at the center of the silicon substrate 62 is lower than its intended value throughout the surface of the silicon substrate 62. As a result, the specific resistance thereof is high (FIG. 19). The impurity concentration is different from silicon substrate 62 to silicon substrate and among other things the impurity concentration of the silicon substrate 62 at an upper level of the process tube 60, that at an intermediate level thereof and that at a lower level thereof are different from one another. As a result, the specific resistances of the silicon substrates 62 are different.

The difference in specific resistance along the longitudinal direction of the process tube 60 varies with gas flow and exhaust air speed. In the conventional diffusion furnace, a temperature gradient is given along the longitudinal direction of the process tube 60 in an attempt to compensate for non-uniformity of the specific resistance of the silicon substrates 62. An alternative way to compensate for non-uniformity among the silicon substrates 62 is to rotate the boat 63 carrying the silicon substrates 62. However, an improvement in specific resistance can not be observed because rotation of the silicon substrates 62 itself is axis symmetric. As an improvement over the prior art devices, an injector 70 as shown in FIG. 20 is suggested along the longitudinal direction of the process tube 60. The injector 70 of FIG. 20 is designed to have apertures of a diameter of about 1 mm at an interval which is a multiple integer of the pitch of the silicon substrates placed. Within this design of the injector 70, however, the speed of a gas injected from an aperture near the gas inlet 68 is different from the gas speed at the aperture near the tip of the injector 70. The gas injection speed near the gas inlet 68 is much greater than that at the tip of the injector 70. To this end, the specific resistance is substantially different between the silicon substrates at upper and lower levels of the process tubes 60. With respect to uniformity throughout the surface of each silicon substrate 62, when the apertures are oriented toward the silicon substrate 62, the gas flow rate is too high so that a temperature drop is seen throughout the surface of the silicon substrate 62. To this end, the specific resistance increases and an appropriate value of specific resistance is not assured at a most remote portion thereof from the aperture. The silicon substrate 62 exhibits a higher value of specific resistance at the center portion thereof. The distribution of specific resistance throughout the surface of the silicon substrate 62 is suggested in FIG. 21(a). Contrarily, when the apertures are oriented to a tube wall of the process tube 60 opposite the silicon substrates 62, the gas impinges on the tube wall and decreases in speed and the gas reflected reaches the silicon substrates 62. This results in an appropriate value of specific resistance at the portion thereof near the injector 70. However, there is no sufficient speed of the gas flow and the specific resistance of the silicon substrates 62 increase at portions thereof remote from the injector 70. The distribution of specific resistance throughout the surface of the silicon substrates 62 is shown in FIG. 21(b). A silicon substrate rotation mechanism is very effective when the above mentioned injector 70 is in use. Although the rotation mechanism makes the specific resistance substantially even and uniform at the peripheral portion of the silicon substrate 62, the specific resistance is still high at the center portion of the silicon substrate 62. The distribution of specific resistance, when the injector 70 and the silicon substrate rotation mechanism are combined, is shown in FIG. 22. However, the disadvantage of the silicon substrate rotation mechanism should be noted that the mechanism is difficult to secure reliability and itself complicated and expensive, because the rotation mechanism is installed in high temperature and corrosive gas atmospheres.

Those devices may be used for impurity diffusion in some occasions and for annealing and oxidation in other occasions. When they are used for oxidation, steam generated from combustion of hydrogen gas and oxygen gas at a temperature of 760° C. or higher is used for oxidant. This oxidation method is known as "pyrogenic oxidation method" and used for formation of gate oxide layers and isolation oxide layers. This method is excellent in purity and controllability of the content of the steam. The pyrogenic oxidation is generally carried out in such a manner as to eject mixed gas of oxygen and hydrogen from the tip of an injector inside a process tube of an oxidation furnace and fire the mixed gas at high temperature furnace atmosphere to generate the water vapor. At this time the ratio of the flow rate of hydrogen to that of oxygen is set at less than 180% in view of critical explosive condition and safety requirement. The temperature of the tip of the injector should be 760° C. or more. The ratio of the steam to the whole oxidizing atmosphere is determined by adjustment of the flow rate of oxygen to hydrogen. The rate of growth of an oxide layer during steam oxidation process is determined by the partial pressure of steam in the atmosphere. In other words, the partial pressure of steam in the oxidizing atmosphere may be lowered when the gate oxide layer should be thin and thickness controllability is of importance. The steam may be generated through combustion of hydrogen and oxygen in an oxygen rich atmosphere.

In those conventional pyrogenic oxidation methods, combustion occurs within the process tube. However, if combustion of hydrogen and oxygen occurs within the process tube, the thickness variation problems come up because the temperature in the process tube become unstable due to high temperature combustion gases. To this end, the external combustion method is often used where a combustion chamber is placed outside the process tube and an exclusive combustion heater is used to fire hydrogen and oxygen by a combustion heater. FIG. 23 is a conceptional diagram of a conventional oxide layer formation furnace with a combustion heater installed outside the process tube. The oxide film formation furnace illustrated includes a process tube 81, a silicon substrate 82, a boat 83, an external combustion chamber 86, an external combustion heater 87, an injector 88, an oxygen port 89, a hydrogen port 90, and a hydrooxygen flame 91. Hydrogen gas from the hydrogen port 90 and oxygen gas from the oxygen port 89 are mixed and heated by the external combustion heater 87 in the injector 88. The hydrogen and oxygen gas heated up to higher than 760° C. fires and then is sent to the combustion chamber 86 as the hydrooxygen flame 91 and the steam generated is conveyed to the process tube 81.

In the manufacture of the semiconductor devices, the autodoping causes the crucial problems as discussed above, including substantial change in the threshold voltage of the MOS transistors, the short channel or offset gate in the MOS transistors, increase in the resistance of the contact diffusion layers and increase in the diffusion depth of the junctions.

In spite of the above discussed problems, the IC technology has advanced to VLSI and the multi-layer poly-silicon layers have been widely used as gate electrodes in the industry. Thus, those problems caused by the autodoping tend to have become serious. In particular, the conventional horizontal type electric furnaces have been replaced by the vertical electric furnaces due to the requirement of uniform thickness of oxide layers and ease of automation and other factors. The inventors' investigation has revealed that the vertical type electric furnace tends to cause the autodoping more easily than the horizontal type, because gases are not equally distributed between the adjacent silicon substrates and especially at the center portion of the silicon substrates due to the structural attributes of the vertical type. In the case where the poly-silicon layers containing the conductive impurity are disposed on the back and front surfaces of the silicon substrates, selective removal of the backside poly-silicon layers prevents the potential autodoping during subsequent thermal processing. However, where the poly-silicon layers are present as desired patterning on the top surface of the silicon substrate, the problems of autodoping remains pending and unresolved.

In the conventional thermal treatment devices, there is a demand for a structure by which impurity-containing gases are supplied uniformly throughout the silicon substrates and also in the longitudinal direction of the process tube 60 without a silicon substrate rotation mechanism.

There are several ways to make equal the gas ejection speed from the gas orifices 71 arranged along the longitudinal direction of the injector 70. One way is to gradually increase the diameter of the gas ejection orifices 71 from the gas inlet 68 of the injector 70 to the tip of the injector 70. Another way is to decrease the spacing of the gas orifices 71. Those methods, however, face difficulty in calculating the diameter of the gas outlets 71 in order to attain equal speed and machining the gas outlets 71. Due to the aging, the diameter of the gas orifices 71 would change and the respective gas orifices would lose balancing. Another attempt to secure uniformity throughout the surface of the silicon substrate is to use more than one injector 70. However, this approach needs two or more gas systems and balancing among the injectors 70. This makes a spacial margin (or clearance) smaller between the process tube 60 and the silicon substrates 62.

In the conventional pyrogenic oxidation method and particularly the pyrogenic oxidation in oxygen-rich atmosphere, normal combustion condition is not seen for combustion of hydrogen and oxygen gases at the tip of the injector 88, because of a much amount of oxygen gas. Normal combustion is attained when the ratio of the hydrogen flow to oxygen flow is in the neighborhood of 180%, where the temperature of the hydrooxygen flame 91 is relatively low. However, in the event that oxygen content is greater, combustion is explosive and the temperature of the hydrooxygen flame 91 is extremely high due to an excessive amount of oxygen. In the conventional design of injector 88, the hydrogen and oxygen gases are mixed and ejected from the single injector 88. Because the tip of the injector 88 is usually narrowed in diameter, the ejection speed of the hydrogen/oxygen mixed gas from the tip of the injector 88 is extremely high.

SUMMARY OF THE INVENTION

To achieve the above mentioned object or objects, the present invention provides a method of manufacturing a semiconductor device, which comprises the steps of preparing a semiconductor substrate, forming a diffusion layer of a high concentration of an impurity or a conductive layer containing a high concentration of an impurity on the semiconductor substrate, forming an oxide layer on a surface of the semiconductor substrate except in a region covered with the impurity diffusion layer or the conductive layer, said forming of the oxide layer comprising a first step of introducing the semiconductor substrate into an oxidation apparatus, a second step of keeping the semiconductor substrate at a desired temperature, and a third step of annealing the semiconductor substrate at the desired temperature, wherein the first, second and third steps are carried out in a mixed atmosphere of oxygen and nitrogen.

The present invention also provides a method of manufacturing a semiconductor device, which comprises the steps of preparing a semiconductor substrate, forming a diffusion layer of a high concentration of an impurity or a conductive layer containing a high concentration of an impurity on the semiconductor substrate, forming an oxide layer on a surface of the semiconductor substrate except in a region covered with the impurity diffusion layer or the conductive layer, said forming of the oxide layer comprising a first step of introducing the semiconductor substrate into an oxidation apparatus, a second step of keeping the semiconductor substrate at a desired temperature, and a third step of annealing the semiconductor substrate at the desired temperature, wherein the first step is carried out in a low temperature oxygen atmosphere and the second and third steps are carried out in a non-oxidizing atmosphere.

The present invention also provides a method of manufacturing a semiconductor device, which comprises the steps of preparing a semiconductor device, and forming a cell plate on the semiconductor substrate via a capacitor insulating layer, the cell plate being made of a conductive layer containing a high concentration of an impurity, and forming a gate oxide layer, said gate oxide layer forming comprising a first step of introducing the semiconductor substrate into an oxidation apparatus, a second step of keeping the semiconductor substrate and a third step of annealing the semiconductor substrate at the desired temperature, wherein the first, second and third steps are carried out in a mixed atmosphere of oxygen and nitrogen.

The present invention also provides a method of manufacturing a semiconductor device, which comprises the steps of preparing a semiconductor substrate, forming a conductive layer containing an impurity on the semiconductor substrate, carrying out first ion implantation with the conductive layer as mask, oxidizing the semiconductor substrate, said oxidizing step comprising a first step of introducing the semiconductor substrate into an oxidation apparatus after the first ion implantation, a second step of keeping the semiconductor substrate at a desired temperature, a third step of annealing the semiconductor substrate at the desired temperature, wherein the first, second and third steps of nitrogen are carried out in a mixed atmosphere of oxygen and nitrogen, and thereafter forming an insulating layer at a side wall of the conductive layer, and carrying out second ion implantation with the conductive layer and the side wall as mask.

The present invention also provides a method of manufacturing a semiconductor device, which comprises the steps of preparing a semiconductor substrate, forming a conductive layer containing impurities on the semiconductor substrate, carrying out ion implantation by which a first impurity of the impurities having a large diffusion coefficient is doped at a low concentration and a second impurity having a small diffusion coefficient is doped at a high concentration, and oxidizing the semiconductor substrate, said oxidizing step comprising a first step of introducing the semiconductor substrate into an oxidation apparatus, a second step of keeping the semiconductor substrate at a desired temperature, a third step of annealing the semiconductor substrate at the desired temperature, wherein the first, second and third steps of oxidation are carried out in a mixed atmosphere of oxygen and nitrogen.

To solve the above discussed problem or problems, the present invention provides a semiconductor manufacturing apparatus comprising a process tube, a substrate boat disposed in the process tube to carry a semiconductor substrate, and an injector for introducing a process gas into the process tube, wherein the process gas from the injector is supplied in a direction parallel with a top surface of the semiconductor substrate.

To solve the above discussed problem and problems, the present invention provides a semiconductor manufacturing apparatus comprising s process tube, a boat disposed in the process tube, a gas inlet for introducing a gas into the process tube, a gas outlet for discharging the gas from the process tube, and an injector for conveying the gas introduced via the gas inlet to the interior of the process tube, the injector being of a length exceeding the length of the boat in the longitudinal direction of the process tube.

To solve the above discussed problem and problems, the present invention provides a method of manufacturing a semiconductor device which comprises the steps of preparing a silicon substrate, forming on the silicon substrate a poly-silicon layer, a silicon dioxide layer or a silicon nitride layer or a composite layer of a combination of two or more of the above mentioned layers, carrying out thermal oxidation in a steam atmosphere by combustion of hydrogen and oxygen gases, forming on the silicon substrate or on the layer formed on the silicon substrate a poly-silicon layer, a silicon dioxide layer, a silicon nitride layer or any other vapor growth layer, subsequent to and continuous to the thermal oxidation step, wherein the ratio of the flow rate of the oxygen gas to that of the hydrogen gas is 0.56 for the combustion in the thermal oxidation step to add oxygen to water vapor generated by the combustion.

To solve the above discussed problem or problems, the present invention provides a semiconductor manufacturing apparatus comprising a process tube, a combustion chamber disposed outside the process tube for combustion of hydrogen and oxygen gases, an external combustion heater disposed outside the process tube, an injector disposed outside the process tube, means for automatically determining the flow rates of the hydrogen gas and oxygen gas used for the combustion by supplying a water vapor generated in the combustion chamber to the interior of the process tube and introducing oxygen via another inlet formed in the process tube, and calculating means for calculating the amount of oxygen to be mixed into the steam generated from the combustion.

According to a feature of the present invention, the thermal treatment is carried out in the thermal treatment sequence by which the potential adverse effect of the subsequent oxidation step on the surface of the semiconductor substrate is prevented in advance. The potential self diffusion from the high concentration impurity layer is prevented by growth of a thin oxide layer on the surface of the semiconductor substrate. The thermal processing apparatus is equipped with the injector for forcing the process gas to flow in the direction of the diameter of the semiconductor substrates, so that the impurity externally or unintentionally diffused from the high concentration impurity layer on the top surface or back surface of the semiconductor substrate may not remain between the semiconductor substrates and is carried away together with the process gas. The self diffusion is suppressed. These advantages are assured by one of the above mentioned approaches alone but further assured by combination of two or more of the approaches.

Additional features of the present invention are described in relation to the description of the preferred embodiments of the present invention.

BRIEF DESCRIPTION OF THE DRAWINGS

FIGS. 7(a) to 7(c) are illustrations showing a semiconductor manufacturing apparatus according to the present invention;

FIG. 20 is a schematic diagram of a conventional semiconductor manufacturing apparatus;

FIGS. 21(a) and 21(b) are charts showing the distribution of specific resistance on a silicon substrate formed by the conventional semiconductor manufacturing apparatus;

FIG. 24 is a table showing uniformity

DETAILED DESCRIPTION OF THE PREFERRED EMBODIMENT

Figure 1A:
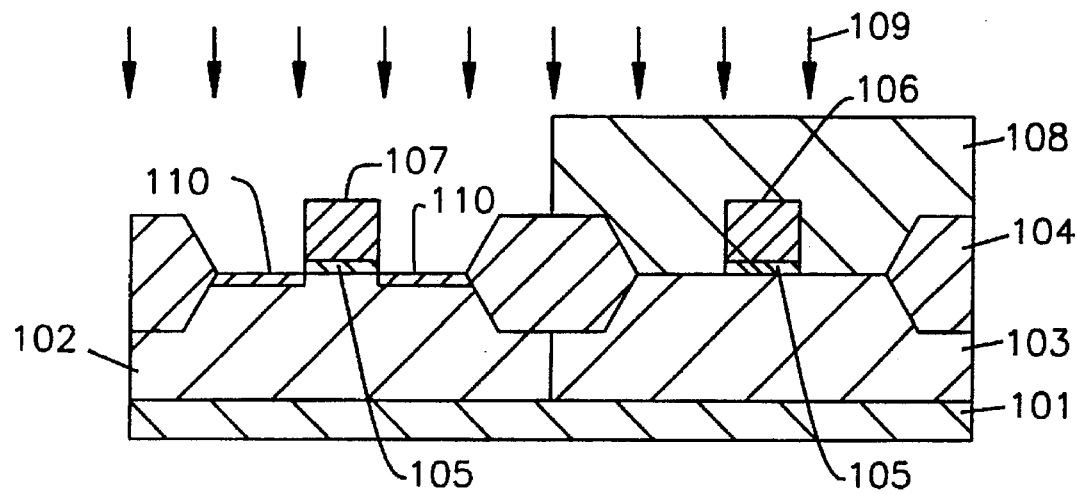
FIGS. 1(a) to 1(c) are device profiles showing a method of manufacturing a LDD structure semiconductor device according to the present invention.

Referring to the drawings, there is illustrated an application of the present invention to a vertical type diffusion furnace for carrying out thermal treatment on a LDD structure MOS transistor.

To form a MOS transistor with LDD structure, the process is different between an N channel transistor and a P channel transistor. Defined on a P type silicon substrate 101 are a P type well region 102 and an N type well region 103. An isolation region 104 lies between the two well regions 102, 103. The N channel transistor is to be formed within the P type well region 102 and the P channel transistor within the N type well region 103. On the silicon substrate 101 there is formed a gate oxide layer 105 on which an N$^+$ type poly-silicon layer 106 is formed as the gate electrode of the P channel transistor. An N$^+$ type poly-silicon layer 107 is formed within the other well region as the gate electrode of the N channel transistor. These poly-silicon layers 106, 107 are doped with phosphorus atoms on the order of $3\times10^{20}/cm^3$. The gate electrodes of the transistors are defined by the well known photolithography technique and dry etching technique. A surface of the silicon substrate 101 is exposed within an LDD region 110 which is to be formed with phosphorus atoms as a source/drain region 114. Because the gate oxide layer 105 has become thinner, even if the oxide layer remains during the dry etching step for the formation of the gate electrodes, the oxide layer may be damaged during the etching step and may be easily removed during a succeeding cleaning step.

To form the LDD region 110 of the N channel transistor, a region where the P channel transistor is to be formed is covered with a photoresist 108 as mask. Then, phosphorus ions 109 are implanted over the whole surface of the substrate to thereby form the LDD region 110. At this moment, the phosphorus atoms of only $2\times10^{12}/cm^2$ (FIG. 1(a)).

Subsequently, side walls are built up on side of gate electrodes. A typical material for the side walls is high temperature oxide layer (HTO) grown by the CVD method or TEOS oxide layer grown by the CVD or the like. Before the deposition of side wall CVD oxide and formation of an oxide layer are carried out to enhance the adherence of the side wall material and activate the phosphorus ions 109 implanted in the LDD region 110 during the preceding step. This thermal treatment, however, would have allowed the phosphorus atoms to deport the gate electrodes of the poly-silicon layers 106, 107 and self diffuse into the LDD region 110. As a result, the conductivity of the LDD region 110 would have turned N type. It implies that the LDD region 110 that was formed by phosphorus ion implantation with low concentration turned high concentration N type region becomes higher concentration. Consequently, the resistance of the LDD region 110 would have decreased so that the phosphorus ions deported would have reached the N type region beneath the gate electrode, thus rendering the channel of the N channel transistor a short channel.

On the other hand, the N type phosphorus atoms in the P channel transistor would have compensated a P type impurity which is to be used to form a source/drain region 115 during a following step. To this end, there would have been developed a PN junction between a high resistance layer or a source/drain region 114 and the bottom of the side walls. Virtually, the P type diffusion layer in the source/drain region 114 would not have reached beneath the gate electrode, rendering the P channel transistor an offset gate transistor.

Figure 1B:
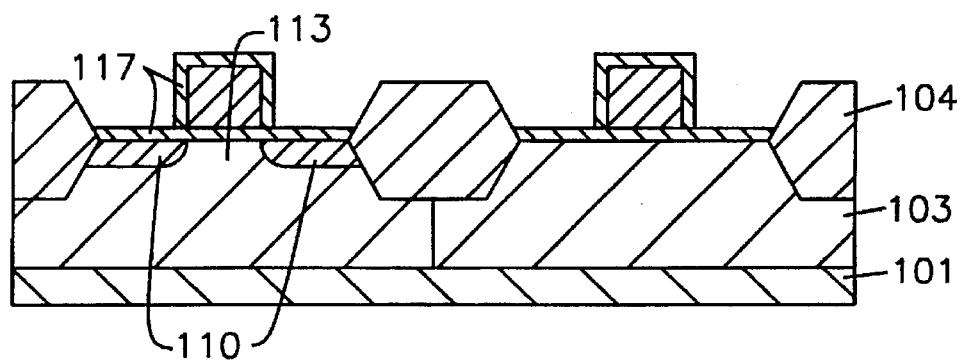

To prevent those undesirable phenomena, a special arrangement or device should be made on an initial stage of the thermal treatment as depicted in FIG. 1(b), the initial state including a step of introducing the silicon substrate 101 into a furnace, a step of temperature ramping and a step of annealing the silicon substrate. A thermal treatment sequence during those steps is shown in FIG. 2.

Figure 2:
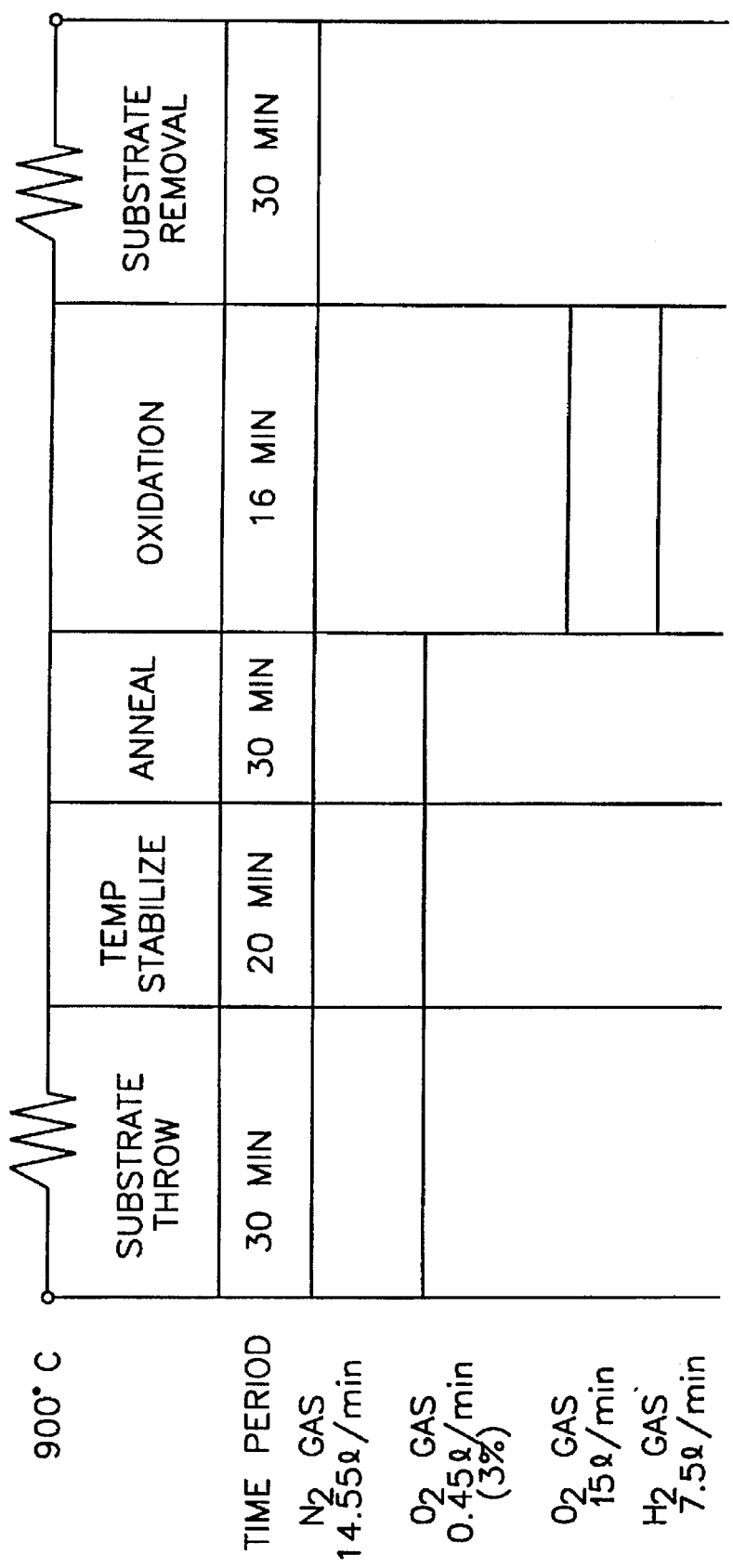
FIG. 2 is a chart showing a thermal treatment sequence of the semiconductor device manufacture method according to the present invention.

In FIG. 2, a nitrogen gas including 1–5 volume % of oxygen is used as process gas during the initial state of the thermal treatment. By this process, a thin oxide layer 117 is developed on a surface of the gate electrodes of the poly-silicon layers 106, 107 containing a high concentration impurity, that is, a source of diffusion, at the beginning of the thermal treatment process. This thin oxide film 117 works as a barrier against external diffusion of the high concentration impurity and in effect suppresses external or unintentional diffusion of the impurity. Furthermore, the thin oxide film 117 is formed on a surface of the LDD region 110. The oxide film 117 prevents the impurity deported from rendering the LDD region 110 a diffusion layer. The initial stage of the thermal treatment is carried out in an atmosphere of a low reactivity not to oxidize the surface of the silicon substrate. In particular, when the ions implanted in the substrate are activated through the thermal treatment, OSF (Oxygen Induced Stacking Fault) may be caused by the existing oxygen. In the illustrated embodiment, the thin oxide film is needed to prevent the impurity diffusion to the silicon surface. Should the temperature of the thermal treatment be a temperature as low as about 700° C., the diffusion of the oxygen would be hardly seen but the desired oxide film would not be developed. On the other hand, if the temperature is about 1000° C., the diffusion of the impurity would be easily produced but the desired oxide film also would be developed. in this manner, the amount of the impurity diffused and the thickness of the oxide film are in a relation of "trade-off." The thickness of the oxide film should be at least 5 nm. For those reasons, the temperature of 900° C. is used for growth of the thin oxide film and oxygen partial pressure is selected at about 1–5 volume %. If the oxygen partial pressure is less than 1 volume %, then the oxidizing force is weak and the impurity diffusion may not be prevented effectively. However, if the oxygen partial pressure is more than 5 volume %, the oxide film is developed to an unnecessary extent to create OSF or crystal defects. If the growth temperature selected is approximately 800° C., the oxygen partial pressure may be selected between 1 and 10 volume % for the above discussed reasons.

The annealing and oxidizing conditions are as follows: The silicon substrate 101 is inserted into the interior of the furnace at a temperature of 900° C. The time for introducing the silicon substrate 101 is about 30 minutes. At this moment, the flow rate of the nitrogen gas in the furnace is 14.55 liter per minute and that of the oxygen gas is 0.45 liter per minute. Once the introduction of the silicon substrate 101 into the furnace is over, the silicon substrate 101 is left for a period of 20 minutes to stabilize the internal temperature of the furnace after proper placement of the silicon substrate 101. Through this step of temperature stabilization, the interior of the furnace is maintained uniformly at 900° C. While the flow rate of the nitrogen gas is maintained at the same level (14.5 liter per minute), oxygen is supplied to the interior of the furnace at 15 liter per minute and hydrogen at 7.5 liter per minute for the oxidation purposes. The oxidizing time is 16 minutes. Thereafter, the supply of oxygen and hydrogen is shut off while nitrogen is kept at the same flow rate when the silicon substrate 101 is to be removed from the interior of the furnace. The time of removal of the silicon substrate 101 is 30 minutes. While nitrogen is permitted to flow during the step where the oxygen and hydrogen flow, the flow of nitrogen may be stopped and only the oxygen and hydrogen are permitted to flow. The reason why the temperature is selected at 900° C. is that the ions implanted are to be activated and 900° C. is proper for redistribution of the impurity and controllability of the thickness of the oxide layer, because the thickness of the oxide film is to be about 300 nm for protection of the surface of the silicon substrate. The time for introducing the silicon substrate selected is approximately 30 minutes in order to minimize stress due to thermal variance and avoid crystal deficits. The flow rate of the nitrogen gas selected is 14.55 liter is proper in amount to purge the interior of the process tube within a short period of time.

The thickness of the oxide film grown at this time is approximately between 3–5 nm in the LDD region 110. The thickness of the oxide film on the surface of the silicon layers 106, 107, however, is 2 to 3 times greater than that in the LDD region 110, while it depends upon the impurity concentration. If the concentration of the impurity contained in the poly-silicon layer bears the above defined value, then the oxide film 117 is grown to a thickness of 8–15 nm on the poly-silicon layers. Since the growth of the oxide film 117 occurs concurrently with external diffusion of the phosphorus atoms contained in the gate electrodes, it is possible to prevent the potential diffusion of the phosphorus into the LDD region 110 due to the autodoping. Therefore, no adverse effect is exerted on the thickness and quality of oxide films to be formed later. In the illustrated embodiment, the nitrogen atmosphere containing 3 volume % oxygen is used during the time of substrate introduction.

The above illustrate embodiment of the present invention is equally effective even in the case where the poly-silicon layer containing a high concentration of an impurity is formed on the back surface of the P type silicon substrate 101 or the back surface of the silicon substrate 101 is exposed and the impurity in the silicon substrate 101 may be attached to or diffused to the adjoining poly-silicon during the thermal treatment.

Figure 1C:
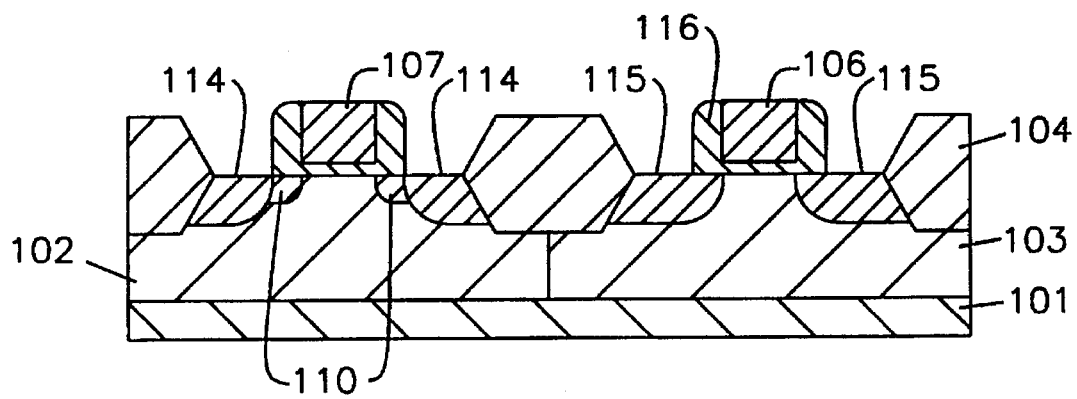

Subsequent to the thermal treatment, an oxide layer is piled up to form side walls 116 of the LDD region 110. The LDD side walls 116 are completed by photolithography and etching steps. With the LDD side walls 116 and the gate electrodes as mask, boron and $BF_2$ are ion implanted in the source/drain regions 114 of the N channel transistor and P channel transistor, respectively, to complete MOS transistors with the LDD structure (FIG. 1 (c)).

In other words, with the LDD side walls 116 and the gate electrodes as mask, the boron is used in the source/drain region 114 of the N channel transistor and the $BF_2$ in the source/drain region 115 of the P channel transistor. In implanting the boron in the N channel transistor the P channel transistor is covered with a resist as mask. In the reverse case, the N channel transistor is covered with a resist as mask.

Under the circumstance, no diffusion region of the phosphorus atoms is observed in the LDD regions of the N channel and P channel transistors due to autodoping. To this end, the effect of a short channel does not occur in the N channel transistor. Moreover, no compensation is seen between the phosphorus atoms and $BF_2$ in the P channel transistor which in turn is not rendered an offset channel transistor.

Figure 3A:
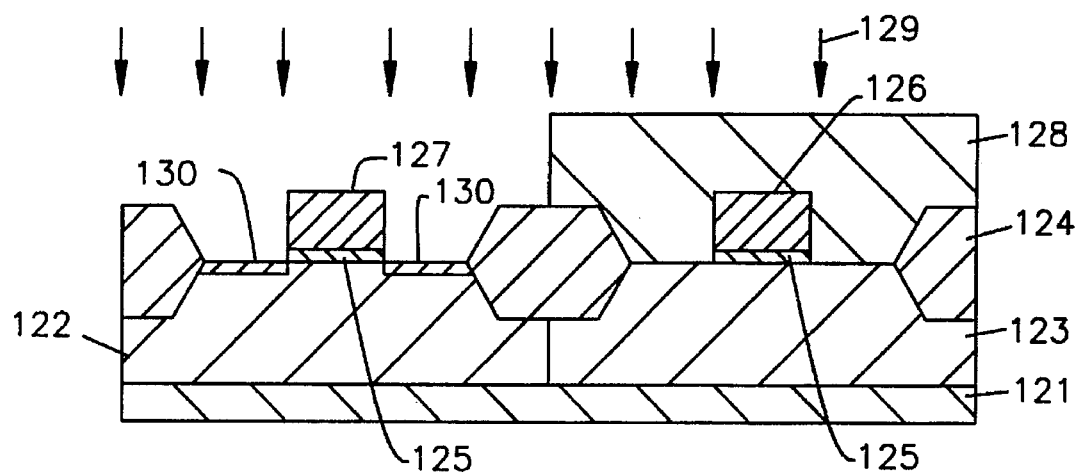
FIGS. 3(a) to 3(c) are device profiles showing a method of manufacturing a DDD structure semiconductor device according to the present invention.
Figure 3B:
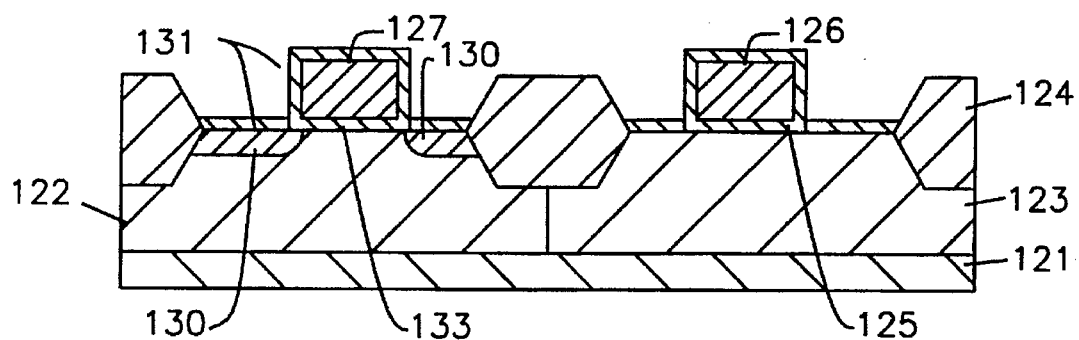
Figure 3C:
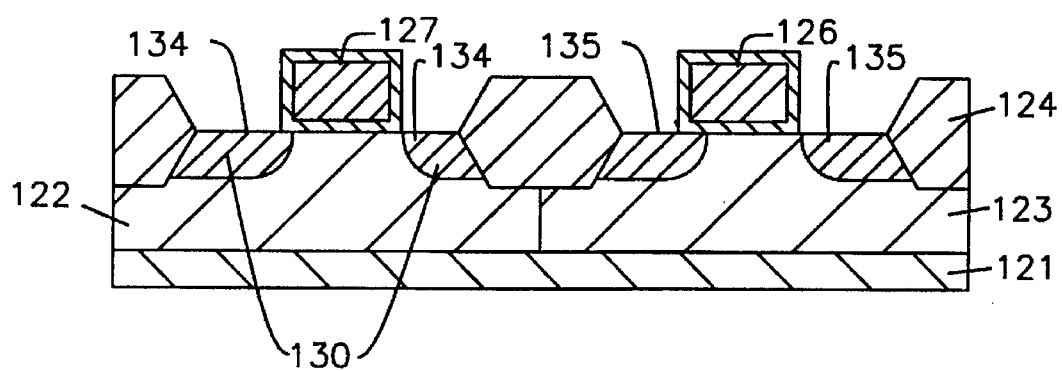

FIGS. 3(a) to 3(c) show an embodiment applied to MOS transistors with a DDD structure.

In FIG. 3(a), a P type well region 122 and an N type well region 123 are defined in a P type silicon substrate 121. At the boundary between the P type and N type well regions, there is formed an isolation region 124 for electrically isolating the two well regions. Gate electrodes are set up via gate oxide layers 125 over the silicon substrate 121 within the well regions 122, 123, respectively. The gate electrode in the N channel well region 123 is composed of an $N^+$ type poly-silicon layer 126 as the gate of the P channel transistor and the other gate electrode is composed of an $N^+$ type poly-silicon layer 127 as the gate of the N channel transistor.

The N type well region 123 is covered with a photoresist 128 as mask. Then, phosphorus ions 129 are implanted to thereby form a DDD region 130. This is followed by desired annealing and oxidizing steps on the silicon substrate 121. At this time a channel region 133 is formed beneath the gate electrode surrounded by the DDD region 130. With the photoresist as mask, ion implantation is effected to form an $N^+$ type source/drain region 134 in the P type well region 122 and a $P^+$ type source/drain region 135 in the N type well region 123.

Figure 4:
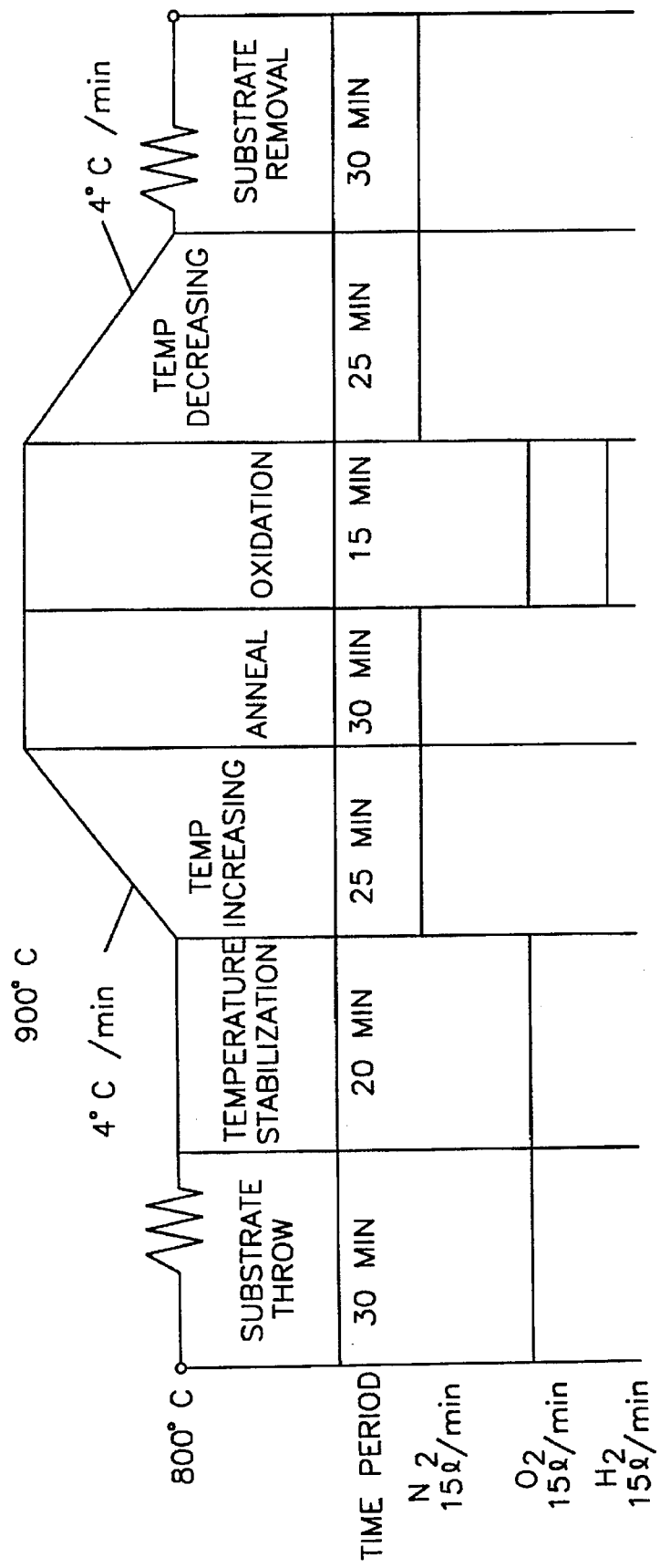
FIG. 4 is a chart showing a thermal treatment sequence of the semiconductor device manufacture method according to the present invention.

Like the LDD structure transistors, the DDD structure transistors have the possibility that the high concentration impurity contained in the gate electrodes may diffuse externally into the DDD regions at steps of annealing and initial oxidizing after the above mentioned step of the phosphorus ion implantation. To avoid the possibility, a thermal treatment sequence as shown in FIG. 4 is employed at the initial stage of the thermal treatment process. While the temperature is held at 800° C., oxygen gas is permitted to flow at a rate of 15 liter per minute. Under the oxidizing atmosphere, the silicon substrate 121 is introduced and thrown for 30 minutes. After the introduction time is over, the silicon substrate 121 is left under the same condition for 20 minutes and the furnace internal temperature is stabilized. Subsequent to the temperature stabilization, the flow of the oxygen gas is shut off and the nitrogen gas is permitted to flow within the furnace at 15 liter per minute. At the same time, temperature is controlled to increase at a rate of 4° C. for 1 minute and reach 900° C. in 25 minutes. Thereafter, annealing is carried out under the nitrogen atmosphere for 30 minutes. These steps lead to that a thin film 131 is developed on surfaces of the poly-silicon layers 126, 127 containing a high concentration of an impurity and a surface of the DDD region to prevent external diffusion of the impurity and diffusion of the externally diffused impurity into the DDD region 130 (FIG. 3(b)).

Thereafter, the nitrogen gas is shut off but the oxygen and hydrogen gases are permitted to flow at 15 liter per minute and 15 liter per minute within the furnace. This condition is maintained for 16 minutes to oxidize the silicon substrate 121. The important feature of this thermal treatment process at this time is the development of the thin oxide film 131 on the surface of the poly-silicon layers 126, 127 and the surface of the DDD region 130 at the initial stage of the thermal treatment process. In the illustrated embodiment, the temperature selected when the silicon substrate is introduced is as low as 800° C. to lessen the possibility of external diffusion. After the oxidation process, the oxygen and hydrogen gases are shut off but the nitrogen gas is permitted to flow at 15 liter per minute. Under this nitrogen atmosphere, the temperature decreases at a rate of 4° C. and reaches 80020 C. in 25 minutes. Then, it takes 30 minutes to remove the silicon substrate 121.

The reason why the temperature selected during the introduction of the silicon substrate is 800° C. is due to the requirement that the diffusion of the impurity during the introducing time be suppressed to a minimum and the amount of the impurity externally diffused from the high concentration impurity diffusion layer be reduced to a minimum. The reason why the oxygen atmosphere is used at this time is that the thickness of the oxide film grown for 20 minutes is 4.5 nm even if the oxygen partial pressure is 100 volume % and this extent of thickness is enough to prevent the diffusion of impurity. The reason why the nitrogen gas flows during the temperature increasing step is that no oxygen gas is needed to flow, because the oxide film is already developed as barrier against the diffusion of impurity during the proceeding steps.

Figure 5A:
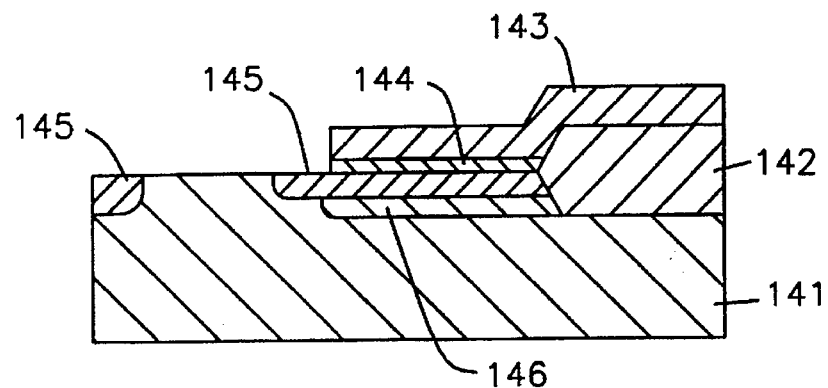
FIGS. 5(a) to 5(c) are device profiles showing a method of manufacturing a semiconductor device and particularly a capacitor according to the present invention.
Figure 5B:
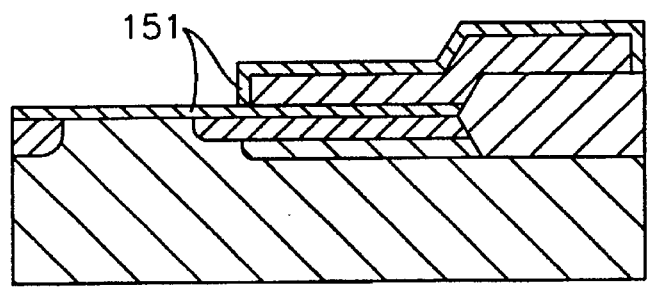
Figure 5C:
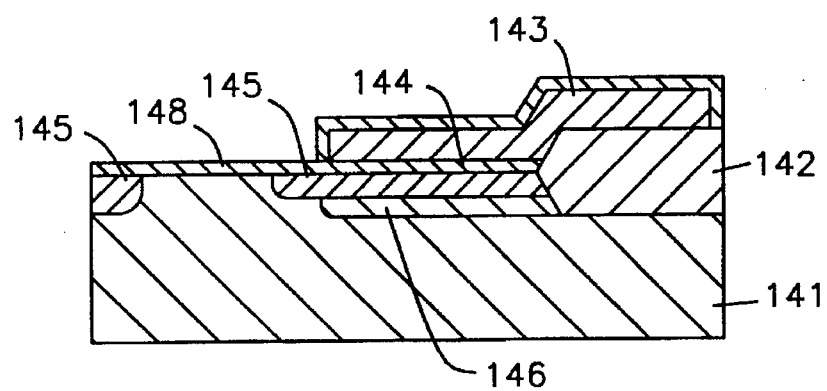
Figure 5D:
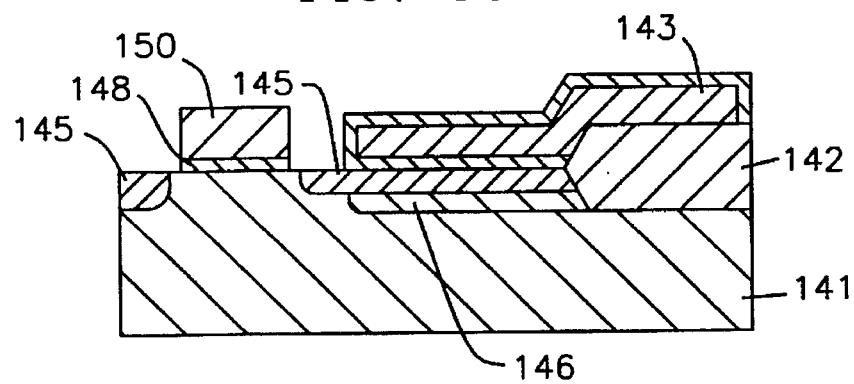

FIGS. 5(a) to 5(c) are device profiles showing a method of forming a gate oxide layer in a DRAM having a two-layered poly-silicon structure according to another embodiment of the present invention. Defined within a desired region of a P type silicon substrate 141 is a field oxide layer as an insulator region 142. Then, a P type diffusion region 146 is defined in the silicon substrate 141. There are further defined $N^+$ type diffusion regions 145 which form a source and drain of a MOS transistor. A capacitor insulating layer 144 and a cell plate 143 of an $N^+$ type poly-silicon layer are formed in a P type diffusion layer 146 on the silicon substrate 141 (FIG. 5(a)).

Figure 6:
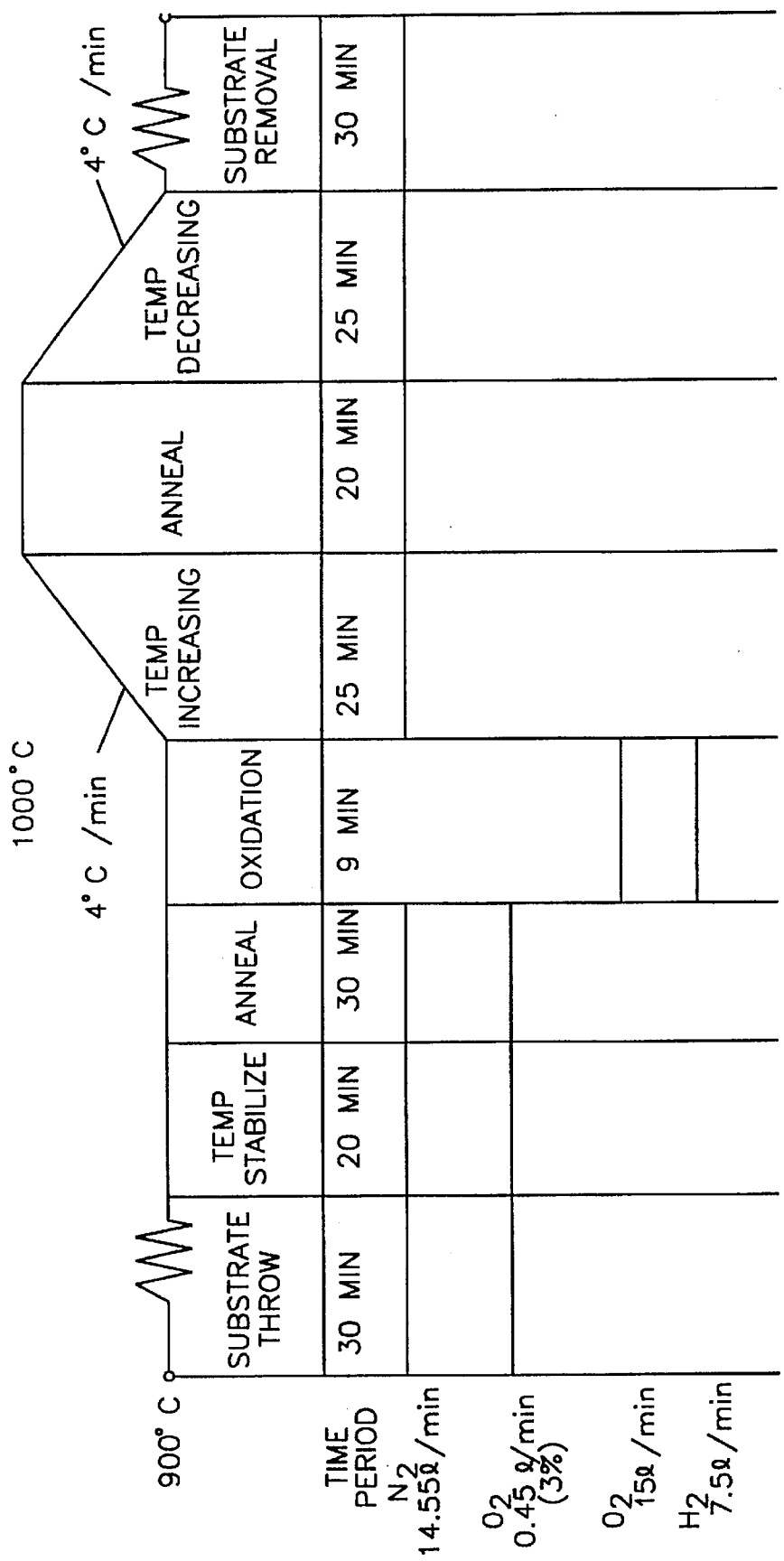
FIG. 6 is a chart showing a thermal treatment sequence of the semiconductor device manufacture method according to the present invention.

Then, a gate insulating layer 148 is formed on a region of the silicon substrate where the MOS transistor is to be formed. Furthermore, a thin oxide layer 151 is formed on a surface of the cell plate according to the teachings of the present invention. It is noted at this time that the cell plate 143 is made up of the poly-silicon layer containing a high concentration of an impurity. For this reason, it is possible that the impurity deported the cell plate 143 may diffuse itself beneath the gate insulating layer at the initial stage of formation of the gate insulating layer 148 on the gate of the MOS transistor or a selector switch. To avoid this, a thermal treatment sequence as shown in FIG. 6 is carried out. While the temperature is kept at 900° C. nitrogen gas is fed at a rate of 14.55 liter per minute and oxygen gas is fed at a rate of 0.45 liter per minute to ensure that the oxygen content is 3 volume %. In the above mentioned atmosphere, it takes 30 minutes to insert the silicon substrate 141. Upon completion of the insert of the silicon substrate 141, the substrate is held for 20 minutes as it is in order to stabilize the furnace internal temperature. The temperature stabilization step is followed by the step of annealing for next 30 minutes. Then, the supply of nitrogen gas is shut off and the flow rate of the oxygen gas selected is 15 liter per minute and that of hydrogen gas is 7.5 liter per minute to complete the oxidation step for 9 minutes. The supply of oxygen and hydrogen gases is shut off and instead the nitrogen gas is fed at a rate of 4.55 liter per minute. At the same time, the furnace temperature increases from 900° C. to 1000° C. at a rate of 4° C. per minute in 25 minutes. It then takes 20 minutes to carry out annealing after the oxidation. In the nitrogen atmosphere, the temperature decreases to 900° C. at a rate of 4° C. in 25 minutes. Under the circumstance, it takes 30 minutes to remove the silicon substrate 141. Through the initial stage of the thermal treatment process, the thin oxide film 151 is formed on the cell plate 143 and the gate region of the selector transistor as shown in FIG. 5(b), which film is effective in preventing the impurity in the cell plate 143 from deporting and unintentionally diffusing into the gate region. In the illustrated embodiment, the thickness of the oxide film 151 formed before the formation of the gate oxide layer 148 is also approximately 5 nm. No adverse effect is observed on the thickness and quality of the gate oxide layer 148 after the succeeding gate oxidizing step (FIG. 5(c)). As in the embodiment of the DDD structure transistors, the same advantage is assured when the silicon substrate is introduced at low temperature under the oxygen atmosphere.

An N$^+$ type poly-silicon layer 150 or gate electrode is then disposed on the gate insulating layer 148 (FIG. 5(c)).

Whereas the foregoing description is directed to improvements of manufacturing methods according to the embodiments of the present invention, manufacturing apparatus equipped with mechanisms which provide a solution to the above discussed problems will be described and illustrated.

An embodiment of the present invention is applied to a vertical type electric furnace where autodoping tends to occur more often. FIG. 7(a) shows a vertical type electric furnace embodying the present invention.

Referring to FIGS. 7(a) to 7(d), a number of silicon substrates 160 are mounted on a substrate boat 165. The substrate boat 165 is installed in the vertical direction of a process tube (vertical direction in the drawing sheet). The silicon substrates 160 are inserted in a direction normal to the substrate boat 165 (that is, a lateral direction in the drawing sheet) with an equal spacing in the vertical direction of the substrate boat 165. An injector 161 is secured within the process tube 162 to supply a process gas 164. In order to carry away an impurity deported between the silicon substrates effectively, a gas flow is needed in a horizontal direction between the silicon substrates 160. To provide such gas flow in horizontal direction, the injector 161 or a gas introduction tube is installed which has horizontal gas orifices at an interval which is a multiple integer of the pitch of the parallel silicon substrates mounted on the boat.

FIGS. 7(b), 7(c) and 7(c) are detailed diagrams of the injector 161 used in the above embodiment of the present invention. The injector 161 comprises a quartz tube having one end closed and has the horizontal gas orifices 166 at an equal spacing along the longitudinal direction of the injector 161. The spacing of the gas orifices is twice as long as the mounting spacing of the silicon substrates 160. FIG. 7(c) is a cross sectional view of a circuit section A in FIG. 7(b) along the longitudinal direction of the injector and FIG. 7(c) is a cross sectional view along the line B–B' in FIG. 7(b).

The injector 161 is of a double tube structure which includes an outer tube of an outer diameter of 10 mm and an inner diameter of 8 mm and an inner tube of an outer diameter of 6 mm and an inner diameter of 4 mm. The process gas 164 supplied via one end of the injector 161 is introduced into the inner tube for a while. As the gas proceeds in the inner tube toward the tip of the injector 161, it is discharged via the gas orifices 167 in a space between the inner and outer tubes. At this time difference in the flow rate of the gas ejected via the gas orifices 167 is seen between the tip and root portions of the injector 161. In other words, the flow rate at the tip portion is slow as compared with that at the root portion. However,because the process gas 164 is first discharged into the gap between the inner and outer tubes for the time being, the gap serves as buffer for the gas flow and suppresses undesirable distribution of the flow rate of the gas along the longitudinal direction of the injector 161. The buffer serves to prevent the flow rate at the tip portion from becoming slower than the flow rate at the root portion and make equal the flow rate, whether at the tip portion or at the root portion. Put in another way, the gas ejected from the coaxial inner tube is stored temporarily with the help of the buffer function, thereby making substantially equal the flow rate at the tip portion and at the root portion when the gas is ejected from the outer tube.

As is seen in the circular cross sectional view of FIG. 7(d), the gas orifices in the outer tubes are formed at an angle of 90° angle. In the illustrated embodiment, the pitch of the gas orifices 166 is 9.76 mm since the silicon substrates 160 are mounted on the substrate boat 165 at a spacing of 4.76 mm. In a given example, the number of the gas orifices 166 is a total of 160. As further seen in FIG. 7(c), gas orifices 167 having a diameter of 2 mm in the inner tube and are oriented at an internal angle of 135° with respect to the gas orifices 166 in the outer tube. It is noted, however, that the gas orifices 167 do not have to assume a spacing as small as that of the gas orifices 166. In the illustrated embodiment, the gas orifices 167 are formed at every 5 pitches of the gas orifices 166. The gas orifices 166 in the outer tube are arranged to cause the gas to flow between the two adjacent silicon substrates 160. For this reason, it may be a better idea to have the same number of the gas orifices as the spacing of the substrates. However, in the illustrated embodiment, the gas orifices 166 are formed at every two spacings of the substrates, because the gas not only ejects from the gas orifices 166 but also spreads at the same time as when it ejected. The gas orifices 167 in the inner tube needs only to eject the gas to the buffer and do not have a specific concern with the spacing between the substrates. However, should the mounting spacing of the substrates be too small, there would be developed difference in the flow rate of the ejected gas between the tip and root portions of the injector. In the illustrated embodiment, the gas orifices 167 are selected at every 5 to 10 spacings of the substrates to secure a proper flow rate even at the tip portion.

With the above mentioned arrangement, the process gas 164 which has been discharged once in the gap between the inner and outer tubes are ejected into the interior of the process tube 162 via the gas orifices 167. At this time, the flow rate of the process gas 164 ejected from the gas orifices 167 is substantially equal either at the tip or at the root portion of the injector 161. The process gas 164 from the gas orifices 166 flows between the silicon substrates 160 in parallel with the top surface and back surface of the silicon substrates. After reaching the opposite wall of the process tube 162, the process gas is discharged via an exhaust gas port. Under the circumstance, the process gas 164 flowing in parallel with the surfaces of the silicon substrates 160 carries away gases containing impurities externally deported from the top and back surfaces of the silicon substrates 160 due to speedy flow thereof. It also prevents the process gas self diffused from the silicon substrates 160 from rediffusing into a silicon exposed region of the surface of the silicon substrates 160. It is recognized that the flow rate of the gas along the process tube having a diameter of 150 mm was 0.7 cm/second without the injector when oxygen or nitrogen flows at 15 liter per minute. When the injector is in use, the flow rate increases to 53 cm/second which is about 76 times as fast as the prior art apparatus. Consequently, the impurities externally diffused could not reach over the substrates and is discharged quickly outside. In other words, the flow rate is about 0.3 cm/second at the center portion of the silicon substrates when the injector is in use. If substrates of 6 inch diameter are used, it takes 50 seconds for the gas to pass through. At this time, the process gas 164 should flow uniformly between the silicon substrates 160. To this end, the gas orifices 166 in the outer tube are formed at an angle of 135°. Further uniform gas flow is assured by rotating the silicon substrates 160.

Although the injector 161 in the above illustrated embodiment has a straight tube structure, it may be of a folded structure for the purpose of retaining heat. The same effect is also enjoyed when the injector 161 is inserted from an upper level of the process tube 162 to a lower level.

In thermally treating semiconductor devices having the high concentration impurity layers or the poly-silicon layers partially or entirely on the top or back surface of the silicon substrates, the present invention prevents effectively the impurities externally diffused from these impurity layers from diffusing unintentionally into the silicon exposed region of the surfaces of the silicon substrates. As a result, the MOS transistors with the LDD or DDD structure are free of variation in threshold voltage or current drive power due to a short channel or offset channel. The present invention prevents autodoping during the step of forming the gate oxide layers in the semiconductor devices having the poly-silicon layers and also prevents variation in threshold voltage.

Figure 8:
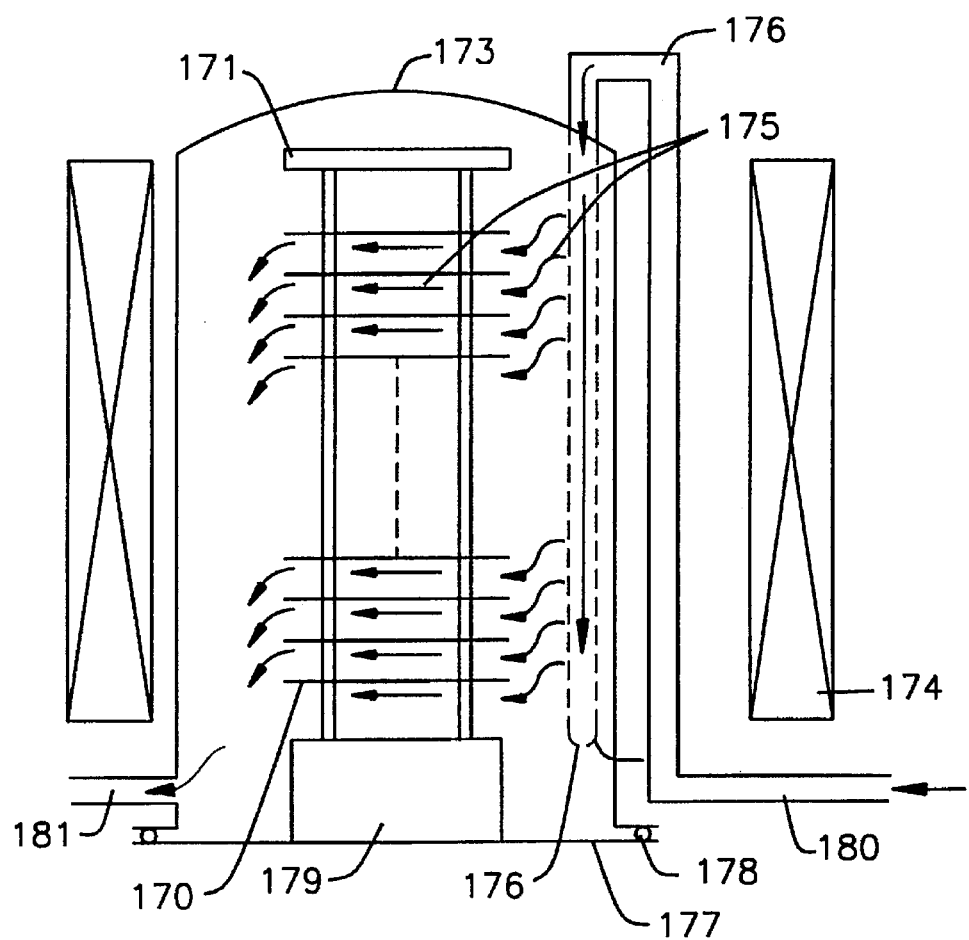
FIG. 8 is an illustration of a semiconductor manufacturing apparatus and particularly a vertical type diffusion furnace.

FIG. 8 shows a cross sectional view of an impurity diffusion apparatus and more particularly another example of vertical type diffusion furnace with a special structure according to the present invention. A number of silicon substrates 170 are mounted on a substrate boat 171. The substrate boat 171 is installed in the vertical direction of a process tube 173 (vertical direction in the drawing sheet). The silicon substrates 170 are inserted in a direction normal to the substrate boat 171 (that is, a lateral direction in the drawing sheet) with an equal spacing in the vertical direction of the substrate boat 171. The substrate boat 171 is installed on a pedestal 179 fixed on a cap 177. The substrate boat 171 retaining the silicon substrates 170 is automatically inserted and removed from a lower level of the process tube 173 through the use of an automatic machine. A heater 174 is provided outside the process tube 173. An injector 176 is secured within the process tube 162 to supply a process gas 175. The process gas 175 introduced via a gas inlet 180 runs through the interior of the injector 176 and enters the process tube 173. The process gas 175 introduced carries out a desired process and then is discharged outside via a gas outlet 181. The injector 176 is designed with a folded structure to ascend from a lower level to an upper level outside the process tube 173 and then descent from the upper level to the lower level inside the process tube 173. The process tube 173 is closed with the cap 177 via a seal 178. With such an arrangement, the process tube 173 operates under low pressure state. The folded back portion is provided with gas orifices 182. The folded structure of the injector 176 permits the process gas to be preheated in the process tube 173 and then supplied to the process tube 173. The injector 176 distributes the process gas 175 throughout the length of the substrate boat 171 retaining the silicon substrates 170.

Figure 9:
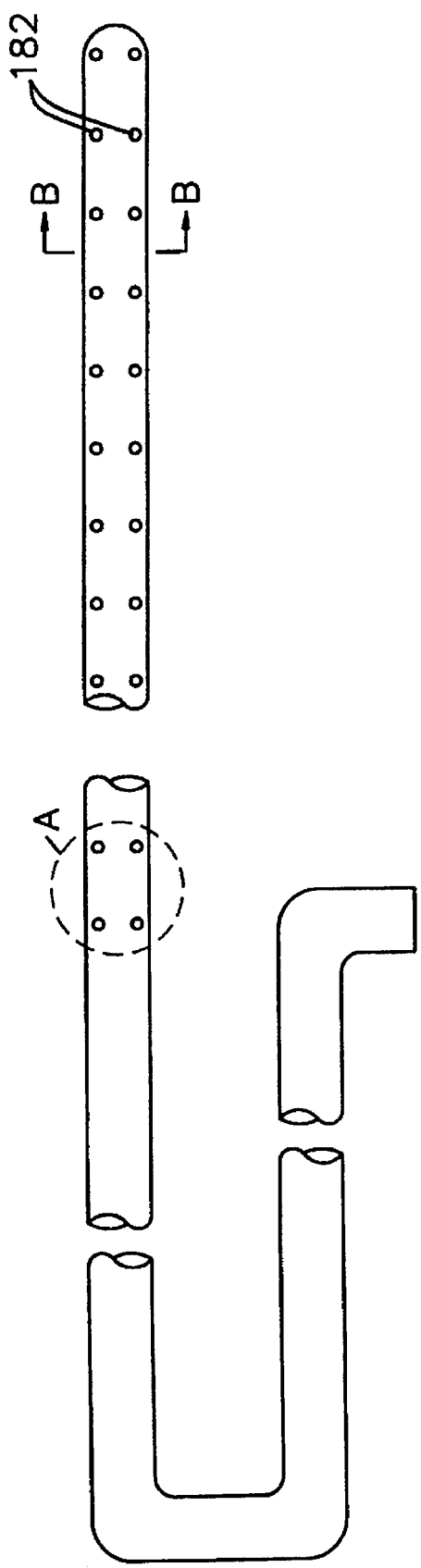
FIG. 9 is an illustration of an injector in the semiconductor manufacturing apparatus according to the present invention.
Figure 10:
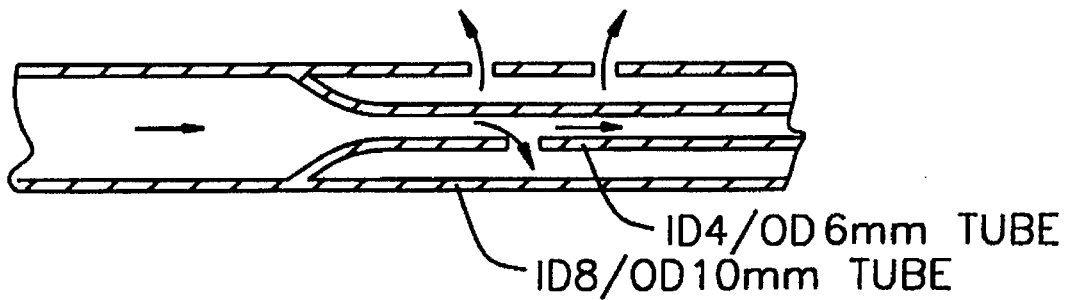
FIG. 10 is a cross sectional view of the injector in its longitudinal direction in the semiconductor manufacturing apparatus according to the present invention.
Figure 11:
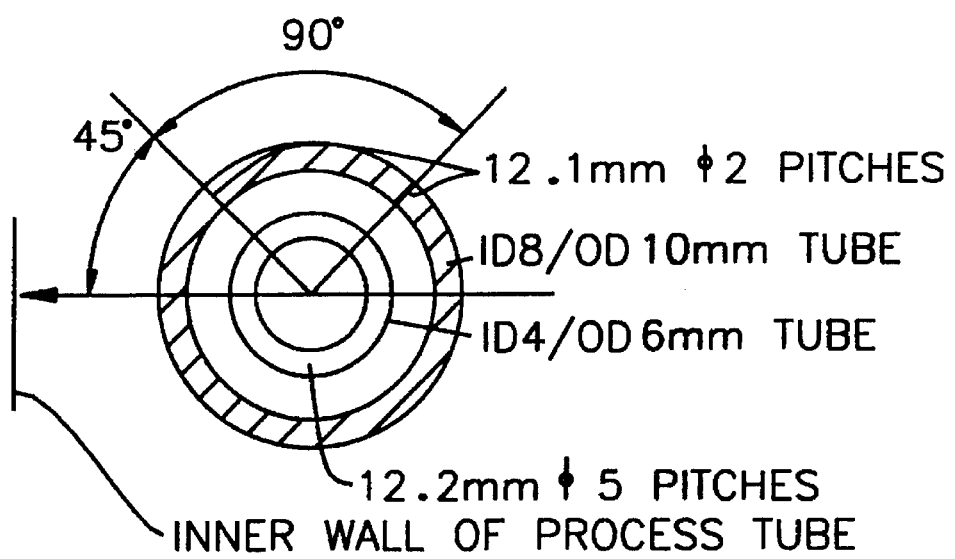
FIG. 11 is another cross sectional view of the injector in the semiconductor manufacturing apparatus according to the present invention.

FIG. 9 shows a structure of the injector used in the impurity diffusion apparatus. FIG. 10 is a cross sectional view of a circle section C of the injector of FIG. 9 along its longitudinal direction. FIG. 11 is a circular cross sectional view along the line D–D' in FIG. 9. FIGS. 9, 10 and 11 are schematic diagrams of the injector 176 according to the present invention. The injector illustrated herein has a structure similar to the injector in the first vertical type diffusion furnace. The injector 176 has a double tube and folded structure where the process gas 175 introduced via a gas inlet 180 is preheated before the folded point and conveyed from the folded point to the inner tube of the double tube structure. At this time, gas orifices 182 in the inner tube lead and discharge the process gas 175 to the gap between the inner and outer tubes. The speed of the gas ejected from the gas orifices 182 in the inner tube is seen different between at the tip portion and folded portion. However, provided that the process gas 175 is discharged into the gap between the inner and outer tubes, the differential speed of the gas is reduced to a substantial extent. Therefore, when the process gas is ejected from the gas orifices 182 in the outer tube, the difference in the gas ejection speed between the tip portion and folded portion of the injector 176 is very small so that the gas ejection speed is uniform and equal throughout the longitudinal direction of the injector 176. This embodiment not only achieves the effect of preventing the external diffusion as the first vertical type diffusion furnace does but also enhances uniformity of flow of the process gas 175 running between the silicon substrates 170. Two types of the gas orifices 182 are arranged at an angle of 90°. The gas orifices 182 are formed in a linear manner along the longitudinal direction of the injector 176 at a spacing which is a multiple integer of the mounting spacing of the silicon substrates 170 on the substrate boat 171. Because in the illustrated embodiment the spacing of the silicon substrates is 5.84 mm, the spacing of the gas orifices 182 in the outer tube which is equal to two pitches of the substrates is 11.68 mm. The diameter of the gas orifices 182 is 1 mm. On the other hand, the spacing of the gas orifices 182 in the inner tube is selected 5 pitches and thus 29.20 mm. The diameter of the gas orifices in the inner tube is 2 mm. The diameter of the gas orifices is determined by the gas ejection speed.

The injector 176 is spaced approximately 5 mm from a wall surface of the process tube 173. The two gas orifices 182 positioned at an angle of 90° are oriented at 45°±15° and at 135°±15° with respect to the direction of the diameter of the process tube 173. In other words, the bisection line for the angle of 90° defined by the two gas orifices 182 is at 90° from the direction of the diameter of the process tube 173 (lateral direction of the tube) and parallel with a tangent line from the wall surface of the process tube 173.

FIGS. 12(a) to 12(d) are diagrams showing how the specific resistance of the poly-silicon layer differs depending upon the arrangement of the gas orifices 182. Examples are shown wherein a process gas resulting from bubbling of oxychloride phosphorus with nitrogen gas is used as a diffusion source. In the examples, impurities are diffused from the process gas to a poly-silicon layer of an oxide layer disposed on a silicon substrate. Oxychloride phosphorus (purity: 99.99999%) is kept at 20° C. as the diffusion source and the gas flows at a rate of 600 cc/minute while nitrogen gas is as carrier gas. As a result, the process gas containing oxychloride phosphorus at 120 mg/minute is generated in the nitrogen gas. A mixed gas of nitrogen and oxygen is added to the process gas at a flow rate of 20 liter per minute and 160 cc per minute, respectively, and then introduced into the process tube. The temperature and time for diffusion are 950° C. and 20 minutes.

FIGS. 12(a) to 12(d) are views of the process tube 173 seen from top. The outer circle shows a peripheral of the process tube 173 and the silicon substrate 170 is placed at the center of the process tube 173. A slant line region on the silicon substrate 170 shows a region where specific resistance is high, whereas the remaining region shows a region where specific resistance is even. Measuring points for determining uniformity of specific resistance are arranged in a grid arrangement extending from the center of the silicon substrate 170 with a spacing of 10 mm in horizontal and vertical directions and amounts to 121 points or more in total within the silicon substrate 171. Uniformity is calculated by evaluating standard deviations from the results of measurements and plotted in terms of the extent of the deviation of specific resistance with respect to a target sheet resistance of 27 Ω/□. The right side of each of the drawings indicates the orientation of the gas orifices 182 of the injector 176. The angle of the gas orifices 182 is shown clockwise from a lateral line passing the center of the gas orifices 182. The direction of the gas ejection from the gas orifices is indicated by the arrow.

Figure 12A:
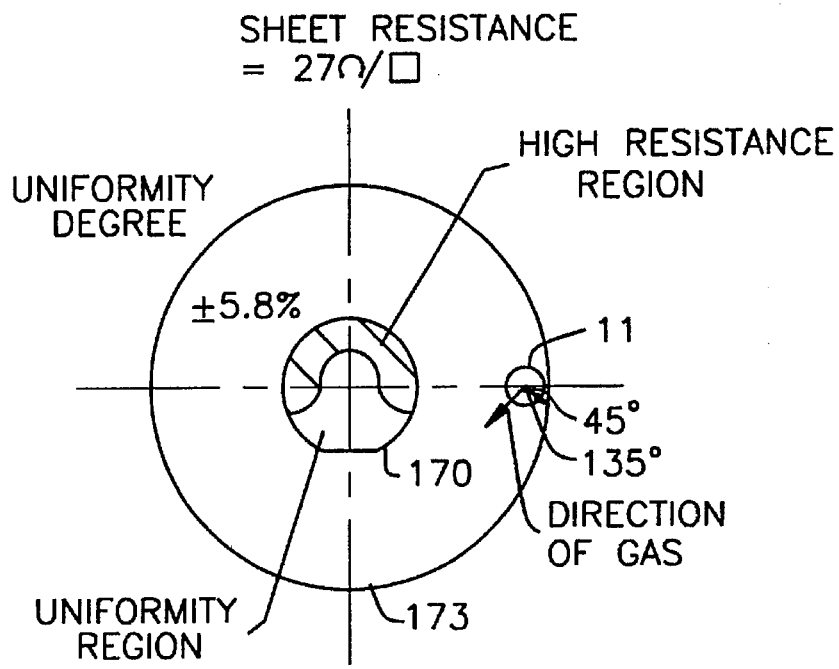
FIGS. 12(a) to 12(c) are diagrams showing the distribution of specific resistance on a semiconductor substrate formed in the semiconductor manufacturing apparatus according to the present invention.
Figure 12B:
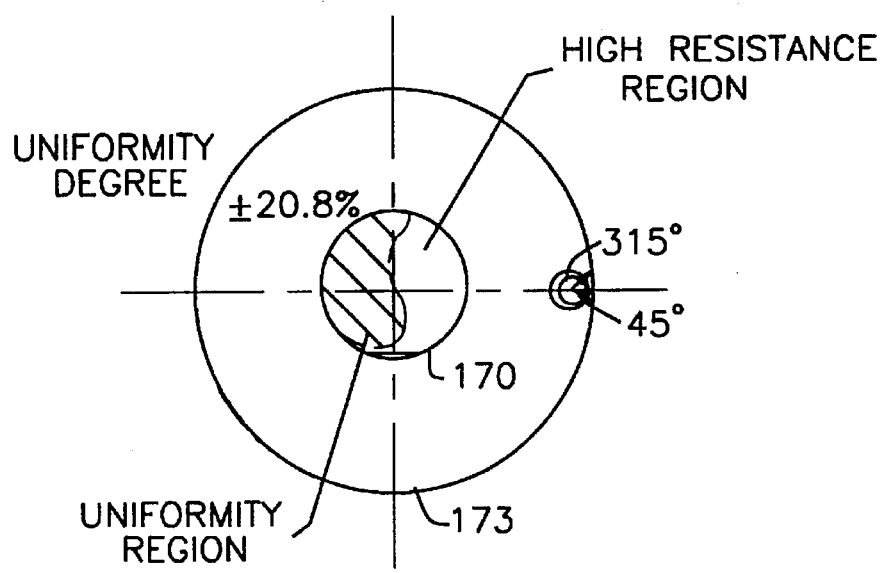
Figure 12C:
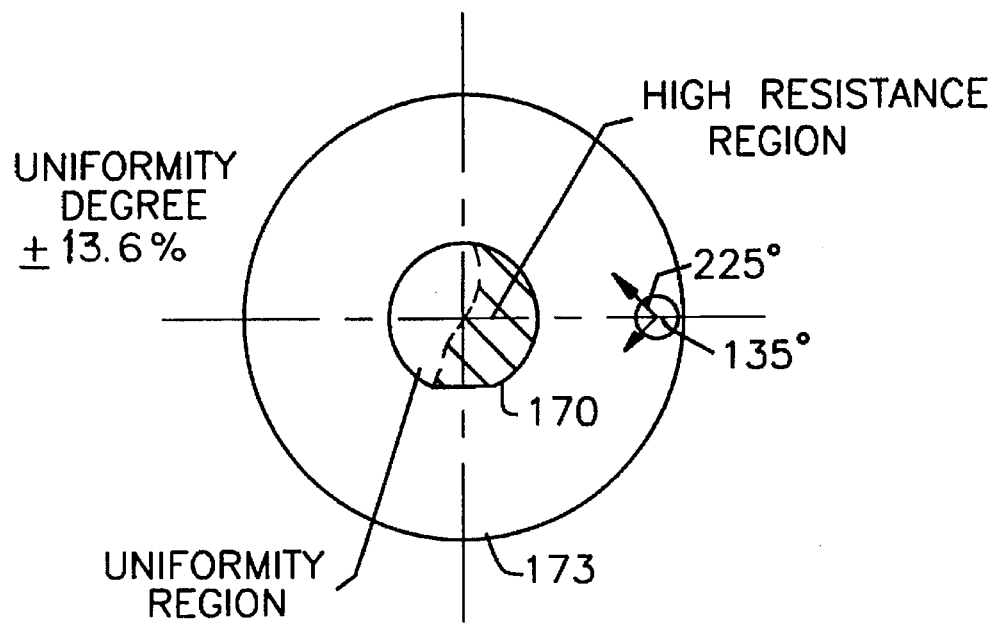
Figure 12D:
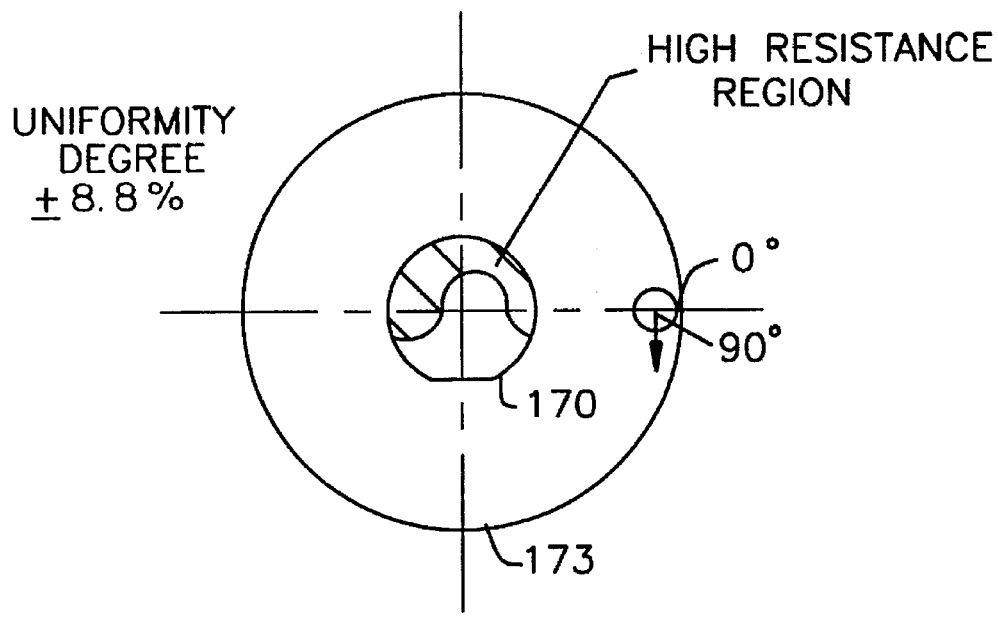

FIG. 12(a) shows the distribution of specific resistance where one of the two gas orifices 182 of the injector 176 is at 45° and the other gas orifices is at 135° with respect to the direction of the diameter of the process tube 173. A high specific resistance region is biased to the peripheral of the silicon substrate but uniformity is relatively good. FIG. 12(b) shows the case where the orifices are at 45° and 315° (the bisection line is parallel with the direction of the diameter of the tube, facing against the wall of the tube). A high specific resistance region occupies a left half with worst uniformity. FIG. 12(c) shows the case where the two orifices are 135° and 225° (the bisection line in parallel with the direction of the diameter of the tube, facing toward the center of the tube). In this case, a high specific resistance region is seen at the right side. Uniformity is not good. Further, FIG. 12(d) shows the distribution of specific resistance throughout the surface of the silicon substrate where the orifices are oriented at 0° and 90° (the bisection line at 45° with respect to the direction of the diameter of the tube). This case shows a distribution similar to that of FIG. 12(a) but its uniformity is a little bit worse than that of FIG. 12(a). It is evident that the case of FIG. 12(a) is best as a whole. It is preferable that the angle of positioning of the gas orifices is within 15° from its desired value. If it exceeds the range, uniformity becomes worse.

Table 1 is the results of measurements of uniformity when the orifice orientation as in FIG. 12(a) is used and target specific resistance is selected at 18 Ω, 27 Ω, 680Ω/□. Uniformity throughout the surface of the silicon substrate 170 and between the silicon substrates is measured through the use of the impurity diffusion apparatus according to the embodiments of the present invention. The number of the silicon substrates treated shows the number of the silicon substrates 170 on the substrate boat 171. In the conventional structure diffusion furnace, dummy silicon substrates or those other than the intended silicon substrates should be mounted on the substrate boat 171 in an attempt to keep the gas flow constant or equal the specific resistance when it is to treat a lesser number of the substrates than the capacity of the diffusion furnace. However, should the injector 176 be used as shown in the above illustrated embodiments, there is no need to mount such dummy silicon substrates and satisfactory uniformity is assured even if the number of the silicon substrates 170 mounted on the substrate boat 171 is 25 or 100 or an intermediate number, for example.

Where the double tube and coaxial type injector having the gas orifices arranged at 90° is used for vapor impurity diffusion as the illustrated embodiments do, impurity diffusion may be carried out on a large number of semiconductor silicon substrates with excellent uniformity throughout the surface of each of the semiconductor substrates and between the respective silicon substrates.

In the above embodiments, the process sequences and the structure of apparatus have been discussed for oxidation and annealing through the use of the vertical type diffusion furnace. The following disclosure will discuss application of the present invention to the pyrogenic oxidation method through the use of horizontal type diffusion furnaces. As discussed previously, the pyrogenic oxidation method in the oxygen rich atmosphere in the horizontal type diffusion furnace does not assure normal combustion condition at the tip of the injector. Combustion due to excessive oxygen is explosive and the hydrooxygen flame exhibits an extremely high temperature. The diameter of the nozzle at the tip of the injector is generally narrower so that the ejection speed of the mixed gas of hydrogen and oxygen from the tip of the injector is very high. Because the injector is generally made of fused quartz, the quartz material at the tip of the injector may be molten with high temperature combustion gases of high speed due to such explosive combustion. The molten quartz is expelled out and introduced in form of fine particles into the process tube together with the combustion gas. If those fine particles are attached to the silicon substrates in the course of manufacture of semiconductor devices, abnormal growth of a poly-silicon layer with the quartz particles as core is seen or uniformity during the etching step is deteriorated. In addition, reflectivity of the surface may change during the patterning by the photolithography technique, causing obstacle to accurate patterning.

Figure 13:
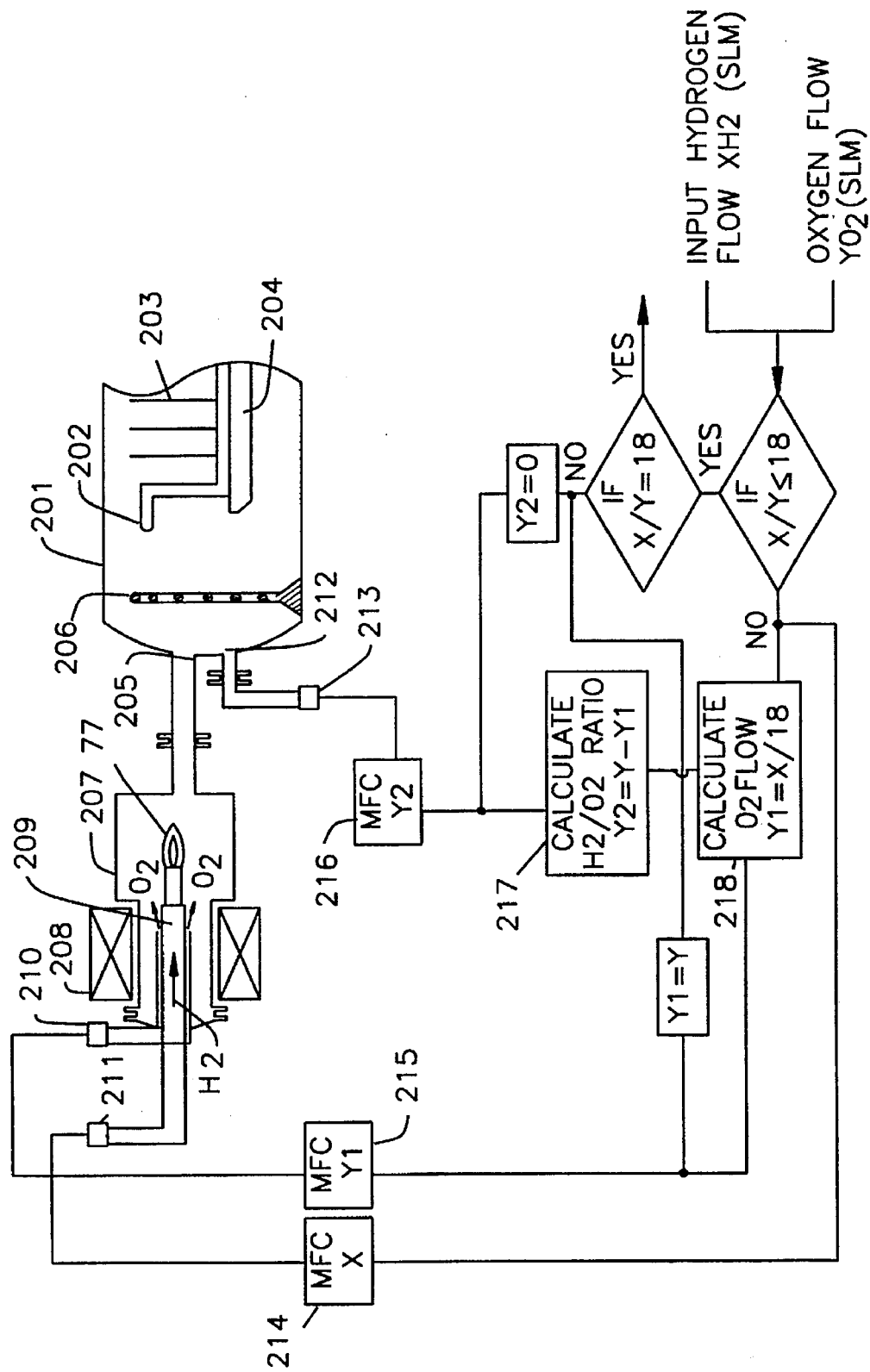
FIG. 13 is a schematic diagram of a semiconductor manufacturing apparatus according to the present invention.

A horizontal type diffusion furnace according to an embodiment of the present invention will be discussed referring to the drawings. FIG. 13 is a schematic diagram of the horizontal type diffusion furnace. In the illustrate embodiment, the pyrogenic oxidation method is used to develop a silicon oxide layer on the silicon substrate to a thickness of 20 nm a ratio of the flow rate of hydrogen to that of oxygen=5:15 (liter per minute), with a growth temperature of 900° C.

In FIG. 13, a number of silicon substrates 203 mounted on a boat 202 are introduced into a process tube 201. The boat 202 is fixed on a cantilever 204. A gas baffle 206 is secured between a gas inlet 205 for introduction of gas into the process tube 201 and the boat 202. An external combustion chamber 207 is secured in the gas inlet 205, which chamber 207 contains an injector 209 inside and carries an external combustion heater 208 secured outside thereof. The injector 209 is equipped with an oxygen port 210 and hydrogen and nitrogen ports 211 for supply of hydrogen gas and nitrogen gas. The process tube 201 is provided with a gas inlet 205 connected to the external combustion chamber 207 and another gas inlet 212 for supply of oxygen gas. The gas inlet 212 is connected to the oxygen port 213. A hydrogen mass flow controller 214, an oxygen mass flow controller 215 and an oxygen mass flow controller 216 are connected to the hydrogen/nitrogen port 211, the oxygen port 210 and the oxygen port 213, respectively. The oxygen mass flow controller 216 is under control by a hydrogen/oxygen mixing rate calculating unit 217. The oxygen mass flow controller 215 and the hydrogen mass flow controller 214 are under control by an oxygen reduction calculating unit 218.

When 5 liter per minute and 15 liter per minute are introduced as input of the flow rate of hydrogen gas and input of the flow rate of the oxygen gas to an input unit, the ratio of the flow rates of hydrogen and oxygen gases for prevention of explosion is confirmed. In the illustrated embodiment, the ratio of the hydrogen gas flow rate to the oxygen gas flow rate is 3:1. The critical upper limit of the ratio of hydrogen to oxygen triggering explosion is 1.8:1. In the given embodiment, there is no risk or problem of explosion. The flow rate of the hydrogen gas is kept at 5 liter per minute without modification. To meet the condition regarding the ratio of the hydrogen gas to the oxygen gas=1.8:1, the flow rate of the oxygen gas is calculated to evaluate 0.56 of the flow rate of the hydrogen gas and in other words 2.78 liter per minute through the oxygen flow rate calculating unit 218.

Figure 14:
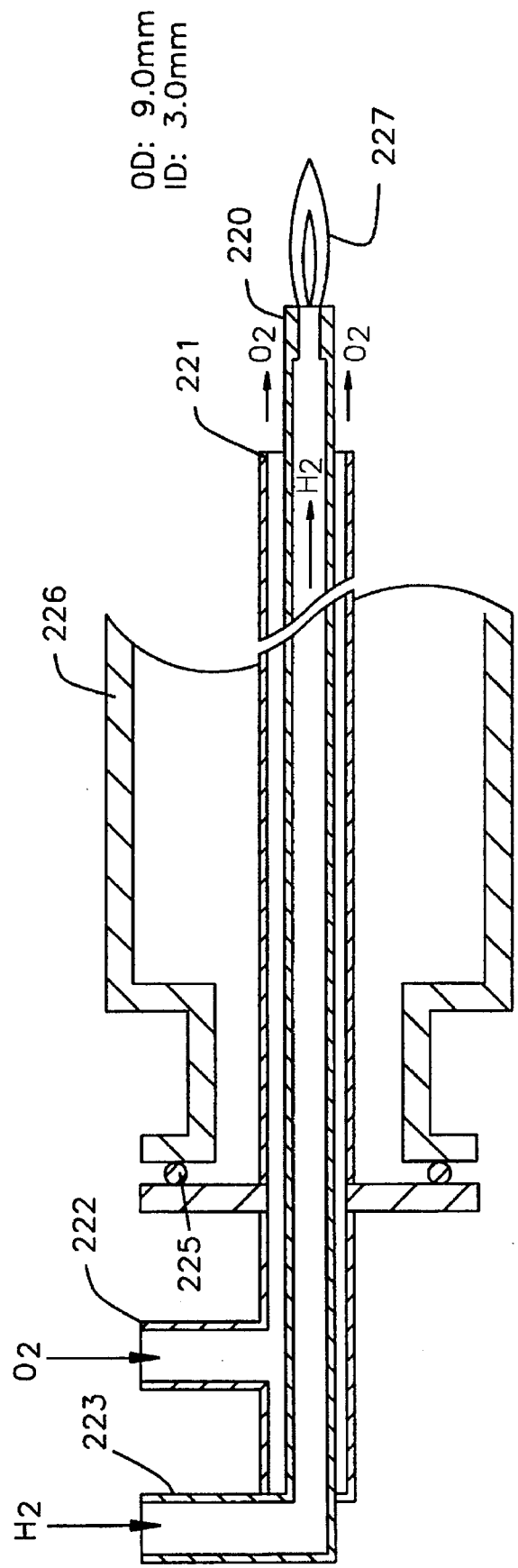
FIG. 14 is a diagram showing an injector in a semiconductor manufacturing apparatus according to the present invention.
Figure 15A:
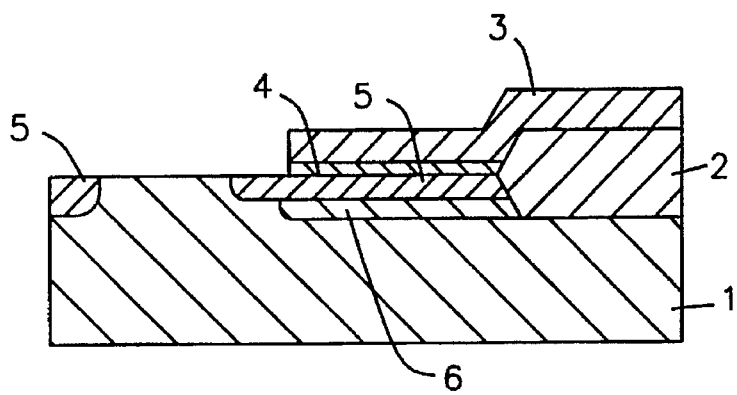
FIGS. 15(a) to 15(d) are device profiles showing a conventional method of manufacturing a semiconductor device and particularly a capacitor element.
Figure 15B:
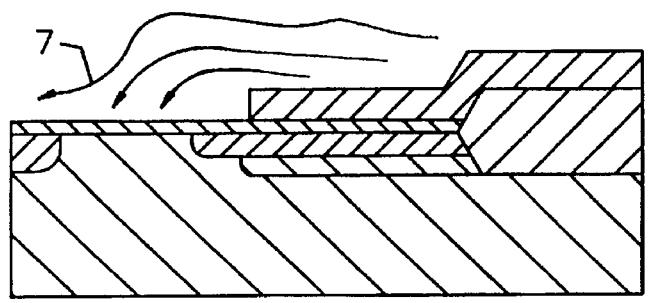
Figure 15C:
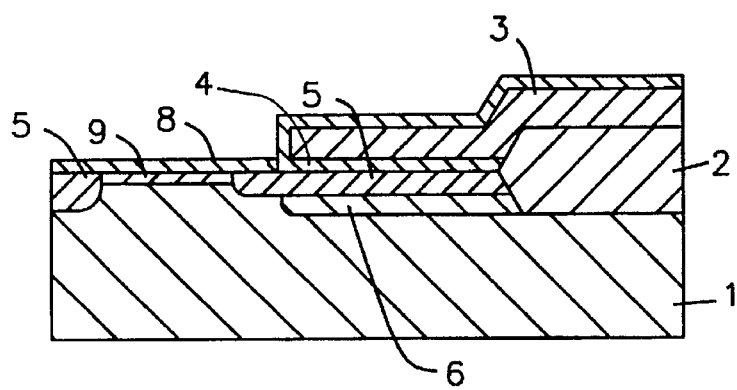
Figure 15D:
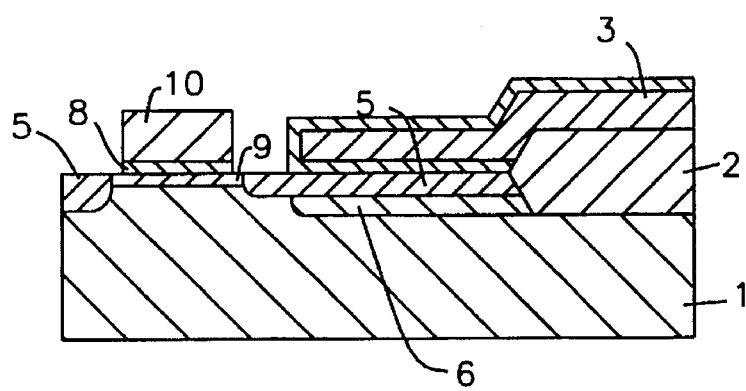
Figure 16A:
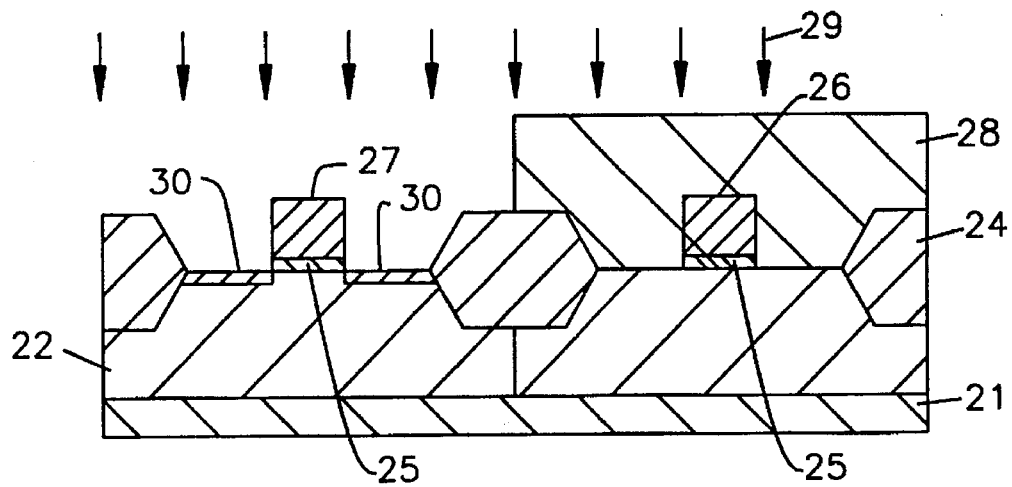
FIGS. 16(a) to 16(c) are device profiles showing a conventional method of manufacturing a LDD structure semiconductor device.
Figure 16B:
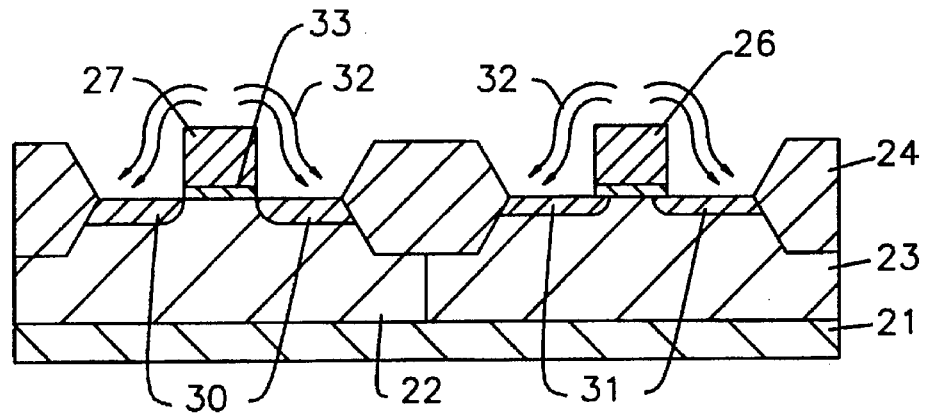
Figure 16C:
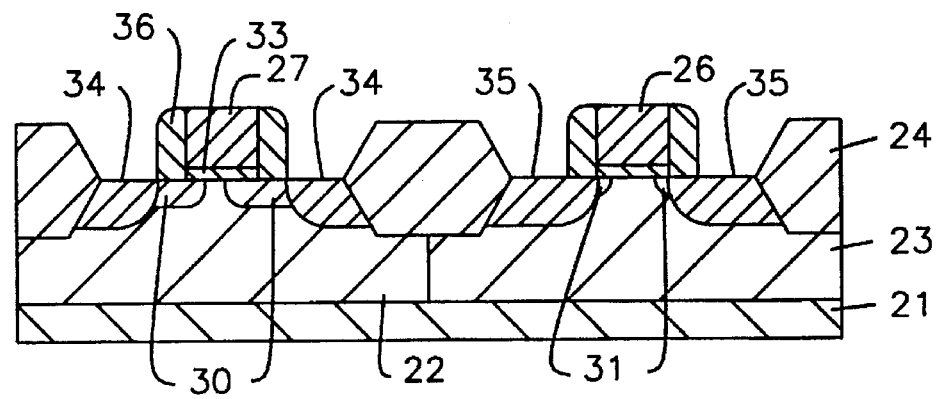
Figure 17A:
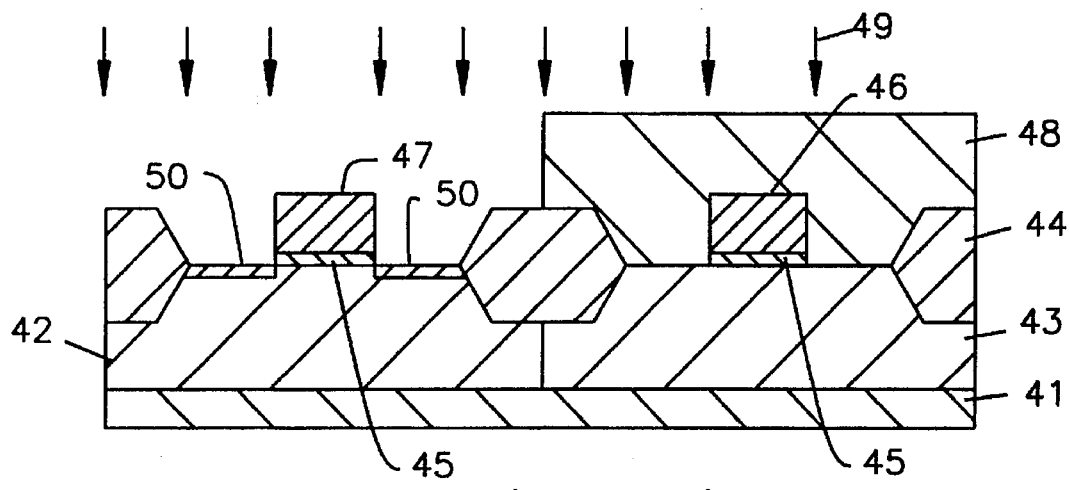
FIGS. 17(a) to 17(c) are device profiles showing a conventional method of manufacturing a DDD structure semiconductor device.
Figure 17B:
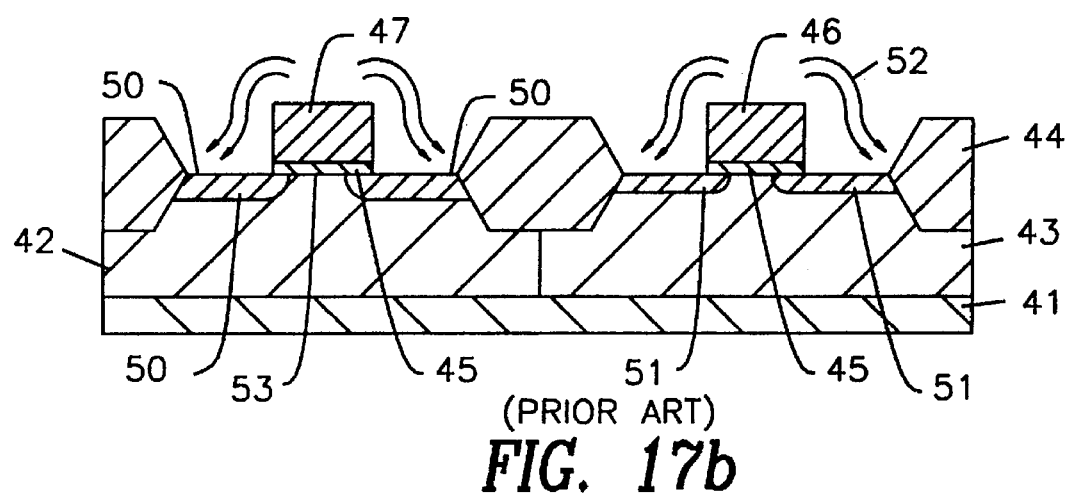
Figure 17C:
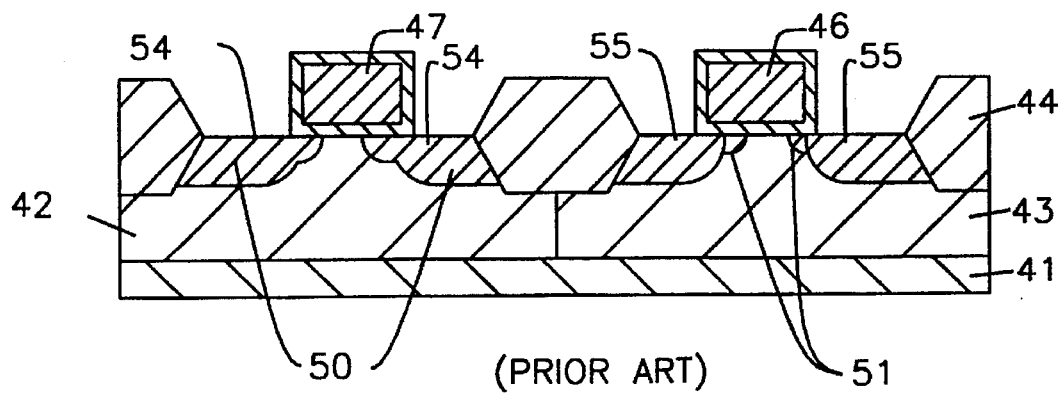
Figure 18:
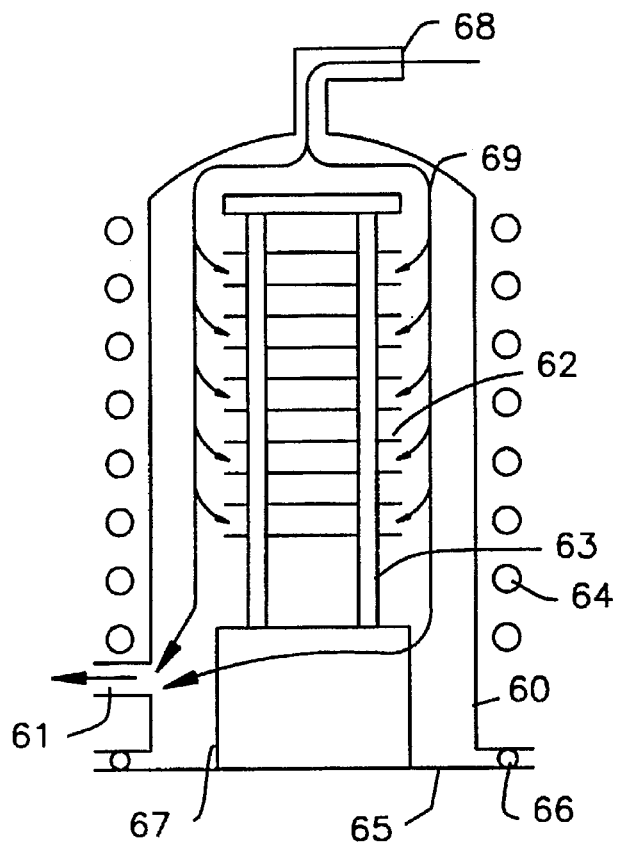
FIG. 18 is a diagram showing a conventional semiconductor manufacturing apparatus.
Figure 19:
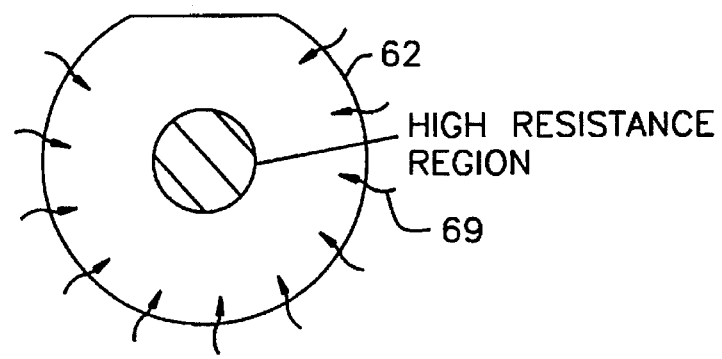
FIG. 19 is a chart showing the distribution of specific resistance on a silicon substrate formed by the conventional semiconductor manufacturing apparatus.
Figures 22, 23:
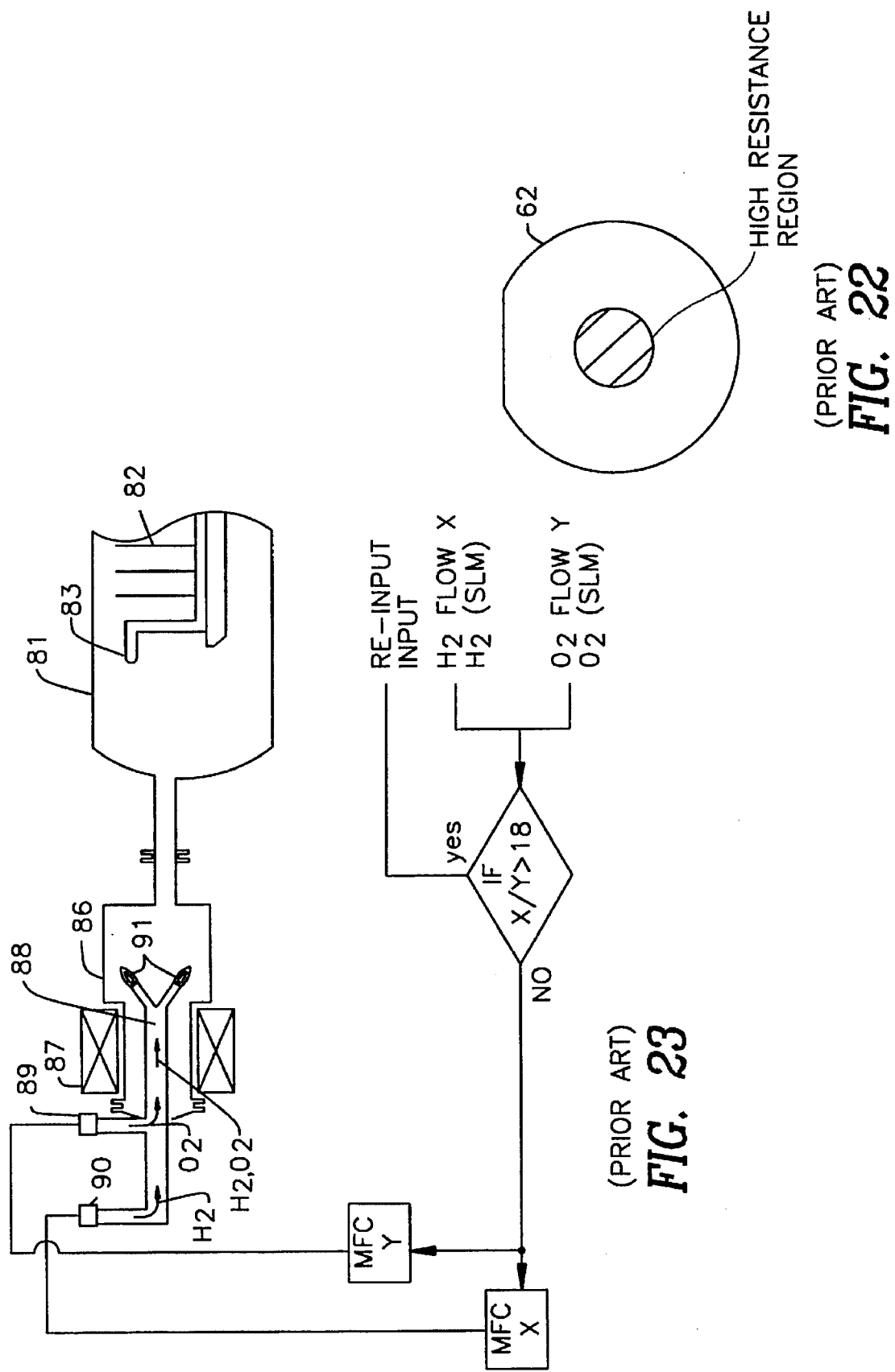
FIG. 22 is a chart showing the distribution of specific resistance on a silicon substrate formed by the conventional semiconductor manufacturing apparatus.
FIG. 23 is a schematic diagram of a conventional semiconductor manufacturing apparatus.

On the other hand, the amount of the oxygen gas to be mixed into the water vapor or steam resulting from the combustion is calculated by the hydrogen/oxygen mixing ration calculating unit 217. In the illustrated embodiment, the intended flow rate of the oxygen gas is 15 liter per minute and the amount of the oxygen gas to be mixed into the water vapor is 12.22 liter per minute. The mass flow controllers 214, 215 and 215 operate depending upon the flow rate of the hydrogen gas and that of the oxygen gas. The hydrogen and oxygen gases whose flow rates are determined by the hydrogen mass flow controller 214 and the oxygen mass flow controllers 215, 216 are supplied to the external combustion chamber via the hydrogen/nitrogen ports 211 and the oxygen port 210. The mixed gas is heated at 800° C. in the injector 209 with the operation of the external combustion heater 208 and burned at the tip of the injector 209. The injector 209 used in this embodiment is shown in FIG. 14.

The injector 209 comprises a tip portion 220, an oxygen gas discharge outlet 221, an oxygen port 222, a hydrogen port 224, an O-ring seal 225 and a combustion chamber 226. A hydrooxygen flame 227 is generated at the tip portion 220 of the injector in operation. The injector 209 has a coaxial shaft configuration where the oxygen gas is introduced via the oxygen port 222 and discharged into the external combustion chamber 221 via an outer tube of the coaxial configuration. The hydrogen gas via the hydrogen port 223, on the other hand, runs through an inner tube of the coaxial configuration to lead to the tip portion 220. Both the hydrogen gas and the oxygen gas are sufficiently heated by the external combustion heater while traveling through the injector 209. In the illustrated embodiment, the tip portion 220 of the injector has only one outlet and has an opening of a diameter of 3 mm. When the flow rate of the hydrogen gas is 5 liter per minute, the ejection speed of the combustion gas is 11.8 m per minute. The heat capacity of the tip portion 220 of the injector is increased by its increased thickness to 3 mm. The tip portion 220 of the injector is designed in this manner not to permit increase in temperature. To enhance the ejection speed, the inner diameter of the ejection opening is increased. To further increase the heat capacitor, the thickness of the tip portion 220 of the injector may be increased. Although in this embodiment high purity fused quartz is used as injector material, synthetic quartz having low content of hydroxyl group (OH) and low impurity content may be used instead. The injector 209 may become worn gradually for a prolonged period of use, because combustion takes place at the tip portion 220 of the injector. Provided however that material having high temperature durability and low impurity content is used as injector material and a piled silicon carbide coating is grown on the surface of the injector material to a thickness of 100 μm by the CVD method, the injector 209 obtained is semi-permanently durable. It is, however, noted that mere increase in the inner diameter of the ejection opening or the thickness of the tip portion is not effective and the length of the hydrooxygen flame 227 and other factors must be taken into consideration. The length of the hydrooxygen flame is determined by the distance between the tip portion 220 of the injector and an article in front thereof and typically approximately 15 to 20 cm.

If hydrogen of 5 liter per minute and oxygen of 2.78 liter per minute are burned at the tip portion 220 of the injector, then the steam or water vapor is generated. The steam is guided to the process tube 201 through the external combustion chamber 226. No fusion occurs at the tip portion 220 of the injector in this embodiment so that quartz particles may not be introduced into the process tube as the prior art apparatus experiences.

To secure the target mixing ratio of the hydrogen and oxygen gases, the mass flow controller 216 supplies the oxygen gas to the oxygen port 213 in the process tube 201 at 12.22 liter per minute. In this manner, the water vapor and the oxygen gas are mixed in the process tube 201 to achieve the target mixing ratio of the hydrogen and oxygen gases. The mixed gases are disturbed by the baffle 206 and conveyed to the silicon substrates 203.

Through the above process, a very clean gate oxide layer of silicon oxide is formed on the silicon substrates. No particles of fused quartz as seen in the past are observed on this gate oxide layer. Therefore, even when phosphorus diffusion is effected by the thermal diffusion for doping the poly-silicon layer with phosphorus atoms through oxychloride phosphorus during a succeeding step, no abnormal growth is observed on the poly-silicon layer. This embodiment does not experience a problem of halation due to surface roughness during a succeeding photolithography step or a problem of etching residues during a succeeding dry etching step.

Although examples of gate oxidation and pile-up of poly-silicon layers have been taken in the above embodiments, it is obvious to those skilled in the art that the advantages of the present invention are equally applicable to formation of an oxide layer for improving the adherence of a pile-up layer prior to the step of such pile-up by the CVD method. The advantages of the present invention is also expected not only for the oxide layer on the silicon substrate but also for silicon oxide layers on the silicon substrate serving as underlying layer or a silicon nitride layer or patterning. It is however noted that adhesion of the fused quartz particles is dependent upon patterns, underlying materials or particle size thereof.

When the silicon oxide layer is formed by the formation technique and apparatus or the pyrogenic oxidation is carried out according to the present invention, fusion at the tip portion of the quartz injector is remarkably suppressed, regardless of the mixing ratio of the hydrogen and oxygen gases, to extend the life of the quartz injector. The present invention also makes it possible to prevent the quartz material at the tip portion of the injector from reducing to fine particles an adhering to the silicon substrates. The present invention also prevents abnormal growth during a pile-up of VD layers following low particles and oxidation and does not degrade machinability, device performance or reliability in carrying out the process.

In carrying out thermal treatment on a semiconductor device having a high concentration impurity layer or a poly-silicon layer containing a high concentration impurity partially or wholly on a top surface or back surface of a silicon substrate, the present invention prevents external or unintentional diffusion and also prevents variation in the threshold voltage of the MOS transistors with LDD or DDD structure or decrease in current drive power.

The semiconductor manufacturing apparatus according to the present invention may carry out impurity diffusion for a large number of semiconductor silicon substrates uniformly throughout the surface of the silicon substrate or between the silicon substrates.

Furthermore, the present invention prevents fusion of the quartz injector material at the tip portion and extends remarkably the life of the quartz injector in carrying the pyrogenic oxidation process.

While preferred embodiments have been described, various modifications and substitutions may be made without departing from the spirit and scope of the invention. Therefore. it is understood that the present invention has been described by way of illustration and not limitation and the spirit and scope of the claims should not be limited to the description of the preferred embodiments.

What is claimed is:

1. A method of manufacturing a semiconductor device with a gate oxide layer comprising the steps of: preparing a semiconductor substrate, forming a diffusion layer of a high concentration of an impurity or a conductive layer containing a high concentration of an impurity on the semiconductor substrate, forming the gate oxide layer on a surface of the semiconductor substrate and a surface of the impurity diffusion layer or the conductive layer, said forming of the gate oxide layer comprising a first step of introducing the semiconductor substrate into an oxidation apparatus, a second step of keeping the semiconductor substrate at a desired temperature, a third step of annealing the semiconductor substrate at the desired temperature and a fourth step of oxidizing the semiconductor substrate for forming the gate oxide layer, wherein the first, second and third steps are carried out in a mixed atmosphere of oxygen and nitrogen, including 1–5 volume % of oxygen, to form a thin oxide film of a thickness of 3–5 nm prior to the formation of the gate oxide layer, said thin oxide film working as a barrier against external diffusion of the high concentration impurity into the surface of the semiconductor substrate to suppress external or unintentional diffusion of the impurity.

2. A method of manufacturing a semiconductor device comprising the steps of: preparing a semiconductor substrate; forming a diffusion layer of a high concentration of an impurity or a conductive layer containing a high concentration of an impurity on the semiconductor substrate, forming an oxide layer on a surface of the semiconductor substrate and a surface of the impurity diffusion layer or the conductive layer, and forming of the oxide layer comprising a first step of introducing the semiconductor substrate into an oxidation apparatus at a temperature ranging between 700° and 900° C., a second step of keeping the semiconductor substrate at a desired temperature between 700° and 900° C. without changing an atmosphere of the oxidation apparatus, a third step of increasing the temperature of the oxidation apparatus to a desired process temperature, a fourth step of annealing the semiconductor substrate at the desired temperature, and a fifth step of oxidizing the semiconductor substrate for forming the oxide layer, wherein the first and second steps are carried out in an oxygen atmosphere to develop a thin oxide film of a thickness of 3–5 nm prior to the formation of said oxide layer, said thin oxide film working as a barrier against external diffusion of the high concentration impurity into the surface of the semiconductor substrate to suppress external or unintentional diffusion of the impurity, and the fourth step is carried out in a non-oxidizing atmosphere and the fifth step is carried out in an oxidizing atmosphere.

3. A method of manufacturing a dynamic random access memory semiconductor device, comprising the steps of: preparing a semiconductor device, and forming a cell plate on the semiconductor substrate via a capacitor insulating layer and a gate region near the cell plate on the semiconductor substrate for selecting transistors, the cell plate being made of a conductive layer containing a high concentration of an impurity, and forming a gate oxide layer to cover the gate region, said gate oxide layer forming comprising a first step of introducing the semiconductor substrate into an oxidation apparatus at a temperature ranging from 700° to 900° C. a second step of keeping the semiconductor substrate at a desired temperature between 700° C. and 900° C., a third step of annealing the semiconductor substrate at the desired temperature, and a fourth step of oxidizing the semiconductor substrate for forming the gate oxide layer, wherein the first, second and third steps are carried out in a mixed atmosphere of oxygen and nitrogen, including 1–5 volume % of oxygen, to develop a thin oxide film of a thickness of 3–5 nm on the cell plate and the gate region prior to the formation of the gate oxide layer for preventing the impurity in the cell plate from deporting and unintentionally diffusing into the gate region, said thin oxide film working as a barrier against external diffusion of the high concentration impurity from the cell plate into the surface of the semiconductor substrate.

4. A method of manufacturing a dynamic random access memory semiconductor device comprising the steps of: preparing a semiconductor device, and forming a cell plate on the semiconductor substrate via a capacitor insulating layer and a gate region near the cell plate on the semiconductor substrate for selecting transistors, the cell plate being made of a conductive layer containing a high concentration of an impurity, and forming a gate oxide layer to cover the gate region, said gate oxide layer forming comprising a first step of introducing the semiconductor substrate into an oxidation apparatus at a temperature ranging between 700° and 900° C., a second step of keeping the semiconductor substrate at a desired temperature between 700° and 900° C. without changing an atmosphere of the oxidation apparatus, a third step of increasing the temperature of the oxidation apparatus, a third step of increasing the temperature of the oxidation apparatus to a desired process temperature, a fourth step of annealing the semiconductor substrate at the desired temperature, and a fifth step of oxidizing the semiconductor substrate for forming the gate oxide layer, wherein the first and second steps are carried out in an oxygen atmosphere to develop a thin oxide film of a thickness of 3–5 nm prior to the formation of said gate oxide layer, said thin oxide film working as a barrier against external diffusion of the high concentration impurity from the cell plate into the surface of the semiconductor substrate to suppress external or unintentional diffusion of the impurity, and the fourth step is carried out in a non-oxidizing atmosphere and the fifth step is carried out in an oxidizing atmosphere.

5. A method of manufacturing a lightly doped drain (LDD) structure transistor semiconductor device comprising the steps of: preparing a semiconductor substrate, forming a conductive layer containing a high concentration of an impurity on the semiconductor substrate, carrying out first ion implantation with the conductive layer as mask to form a lightly doped drain region near the high concentration impurity conductive layer on the semiconductor substrate, oxidizing the semiconductor substrate for forming a gate oxide layer on the high concentration impurity conductive layer, said oxidizing step comprising a first step of introducing the semiconductor substrate into an oxidation apparatus after the first ion implantation, a second step of keeping the semiconductor substrate at a desired temperature or changing the temperature of the semiconductor substrate to the desired temperature, a third step of annealing the semiconductor substrate at the desired temperature and a fourth step for forming the gate oxide layer, wherein the first, second and third steps are carried out in a mixed atmosphere of oxygen and nitrogen, including 1–5 volume % of oxygen, to develop a thin film of a thickness of 3–5 nm on a surface of the high concentration impurity diffusion conductive layer and the lightly doped drain region prior to the formation of the gate oxide layer for prevention of autodoping, said thin oxide film working as a barrier against external diffusion of the high concentration impurity from the high concentration impurity conductive layer to the semiconductor substrate, and thereafter forming an insulating layer at a side wall of the conductive layer, and carrying out second ion implantation with the conductive layer and the side wall as mask to complete the lightly doped drain (LDD) structure transistor.

6. A method of manufacturing a lightly doped drain (LDD) structure transistor semiconductor device according to claim 5 wherein the first step is carried out in oxygen atmosphere at a temperature ranging from 700° to 900° C. and the second and third steps are carried out in non-oxidizing atmosphere and thereafter the insulating layer is formed at a side wall of the conductive layer and the second ion implantation is carried out with the conductive layer and the side wall as mask.

7. A method of manufacturing a double doped drain (DDD) structure transistor semiconductor device comprising the steps of: preparing a semiconductor substrate, forming a conductive layer containing a high concentration of impurities on the semiconductor substrate, carrying out first ion implantation by which a first impurity of the impurities having a large diffusion coefficient is doped at a low concentration and a second impurity having a small diffusion coefficient is doped at a high concentration, to form a double doped drain region near the high concentration impurity conductive layer on the semiconductor substrate, and oxidizing the semiconductor substrate for forming a gate oxide layer on the high concentration impurity conductive layer, said oxidizing step comprising a first step of introducing the semiconductor substrate into an oxidation apparatus after the first ion implantation, a second step of keeping the semiconductor substrate at a desired temperature, a third step of annealing the semiconductor substrate at the desired temperature, wherein the first, second and third steps of oxidation are carried out in a mixed atmosphere of oxygen and nitrogen, including 1–5 volume % of oxygen, to develop a thin oxide film of a thickness of 3–5 nm prior to the formation of the gate oxide layer on a surface of the high concentration impurity diffusion conductive layer and the double doped drain region for prevention of autodoping, said thin oxide film working as a barrier against external diffusion of the high concentration impurity from the high concentration impurity conductive layer to the semiconductor substrate.

8. A method of manufacturing a double doped drain (DDD) structure semiconductor device according to claim 7 wherein the first step is carried out in the oxygen atmosphere at a temperature ranging from 700° to 900° C. to form the 3–5 nm thick oxide film and the second and third steps are carried out in non-oxidizing atmosphere.

* * * * *